US012685236B2

(12) United States Patent
Yu et al.

(10) Patent No.: US 12,685,236 B2
(45) Date of Patent: Jul. 14, 2026

(54) SEMICONDUCTOR DEVICE PACKAGES AND METHODS OF FORMING THE SAME

(71) Applicant: Taiwan Semiconductor Manufacturing Co., Ltd., Hsinchu (TW)

(72) Inventors: Chi-Yang Yu, Zhongli City (TW); Chin-Liang Chen, Kaohsiung City (TW); Hao-Cheng Hou, Hsinchu (TW); Jung Wei Cheng, Hsinchu (TW); Yu-Min Liang, Zhongli City (TW); Tsung-Ding Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 794 days.

(21) Appl. No.: 17/878,647

(22) Filed: Aug. 1, 2022

(65) Prior Publication Data

US 2024/0038646 A1 Feb. 1, 2024

(51) Int. Cl.
*H10N 10/01* (2023.01)
*H10W 70/05* (2026.01)
(Continued)

(52) U.S. Cl.
CPC ......... *H10W 90/701* (2026.01); *H10W 70/05* (2026.01); *H10W 70/093* (2026.01);
(Continued)

(58) Field of Classification Search
CPC ........... H01L 23/49816; H01L 21/4853; H01L 21/4857; H01L 23/145; H01L 23/49822;

H01L 23/49833; H01L 23/49838; H01L 23/49894; H01L 24/16; H01L 24/32; H01L 24/73; H01L 25/0655; H01L 21/486; H01L 2224/16235; H01L 2224/32225; H01L 2224/73204; H01L 2924/1431; H01L 2924/1434; H01L 2924/182; H01L 2924/3511; H01L 2924/35121; H01L 2224/81; H10W 90/701; H10W 70/05;
(Continued)

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |

(Continued)

FOREIGN PATENT DOCUMENTS

| | | |
|---|---|---|
| TW | 201916297 A | 4/2019 |

*Primary Examiner* — Samuel Park
(74) *Attorney, Agent, or Firm* — Slater Matsil, LLP

(57) ABSTRACT

Semiconductor device packages and methods of forming the same are discussed. In an embodiment, a device includes: a redistribution structure comprising an upper dielectric layer and an under-bump metallization; a buffer feature on the under-bump metallization and the upper dielectric layer, the buffer feature covering an edge of the under-bump metallization, the buffer feature bonded to the upper dielectric layer; a reflowable connector extending through the buffer feature, the reflowable connector coupled to the under-bump metallization; an interposer coupled to the reflowable connector; and an encapsulant around the interposer and the reflowable connector, the encapsulant different from the buffer feature.

20 Claims, 22 Drawing Sheets

(51) Int. Cl.

| | |
|---|---|
| *H10W 70/65* | (2026.01) |
| *H10W 70/685* | (2026.01) |
| *H10W 70/69* | (2026.01) |
| *H10W 70/695* | (2026.01) |
| *H10W 90/00* | (2026.01) |
| *H10W 74/00* | (2026.01) |
| *H10W 74/15* | (2026.01) |

(52) U.S. Cl.
 CPC ......... *H10W 70/65* (2026.01); *H10W 70/685* (2026.01); *H10W 70/69* (2026.01); *H10W 70/695* (2026.01); *H10W 90/00* (2026.01); *H10W 90/401* (2026.01); *H10W 70/095* (2026.01); *H10W 74/00* (2026.01); *H10W 74/15* (2026.01); *H10W 90/724* (2026.01); *H10W 90/734* (2026.01)

(58) Field of Classification Search
 CPC . H10W 70/093; H10W 70/65; H10W 70/685; H10W 70/69; H10W 70/695; H10W 90/00; H10W 90/401; H10W 70/095; H10W 74/00; H10W 74/15; H10W 90/724; H10W 90/734; H10W 72/30
 See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,157,871 | B1 | 12/2018 | Yu et al. | |
| 2005/0070083 | A1* | 3/2005 | Johnson | H01L 24/13 |
| | | | | 257/E23.021 |
| 2016/0056087 | A1 | 2/2016 | Wu et al. | |
| 2018/0061669 | A1* | 3/2018 | Liao | C09D 179/08 |
| 2019/0013276 | A1* | 1/2019 | Lee | H01L 21/568 |
| 2020/0105544 | A1* | 4/2020 | Tsai | H01L 21/4853 |
| 2020/0105635 | A1* | 4/2020 | Yu | H01L 23/3677 |
| 2020/0294937 | A1* | 9/2020 | Chen | H01L 24/20 |
| 2020/0395280 | A1* | 12/2020 | Chen | H01L 23/145 |
| 2021/0134731 | A1* | 5/2021 | Guzek | H01L 23/49833 |
| 2022/0068746 | A1 | 3/2022 | Chen et al. | |

* cited by examiner

102A/1650

104
102

102A/1650

SEMICONDUCTOR DEVICE PACKAGES AND METHODS OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
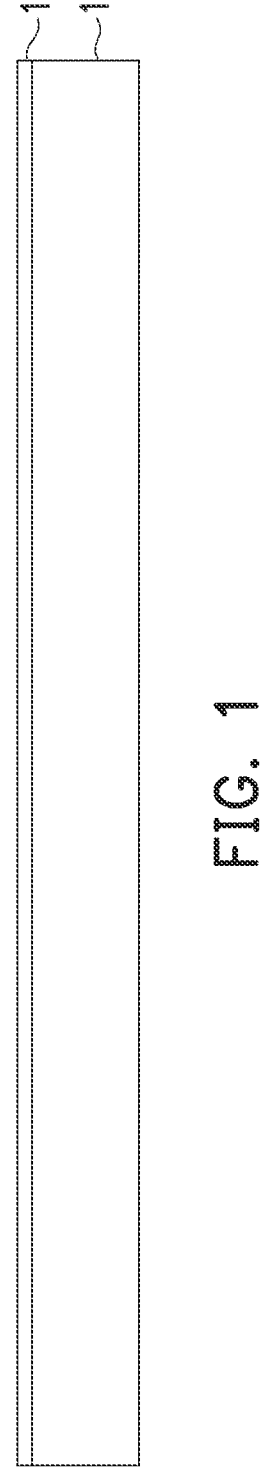
FIGS. 1-16 are cross-sectional views of intermediate steps during a process for forming an integrated circuit package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a redistribution structure is formed comprising dielectric layers and metallization patterns among the dielectric layers. The redistribution structure serves to physically and electrically connect an interposer to a semiconductor device, thereby forming an integrated circuit package. Buffer features (e.g., a buffer layer or buffer rings) are formed around under-bump metallizations of the redistribution structure that are used for coupling to the interposer. The buffer features can facilitate the release of stress caused by a mismatch in coefficient of thermal expansion between the interposer and the semiconductor device. The risk of cracks forming at the edges of the under-bump metallizations may be reduced, thereby increasing device reliability.

FIGS. 1-17 are cross-sectional views of intermediate steps during a process for forming an integrated circuit package 1650, in accordance with some embodiments. In some embodiments, the integrated circuit package 1650 is a chip-on-wafer-on-substrate (CoWoS) package. A package region 102A is shown, in which the integrated circuit package 1650 is formed. It should be appreciated that multiple adjacent package regions 102A can be simultaneously formed, and the integrated circuit package 1650 can be formed in each of the package regions 102A.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a large degree of planarity.

In FIGS. 2-9, a redistribution structure 900 (see FIG. 9) is formed over the carrier substrate 102. The redistribution structure 900 includes dielectric layers 202, 302, 404, 408, 412, 602, and 802; metallization patterns 204, 402, 406, 410, 502, and 702; and UBMs 902. The metallization patterns may also be referred to as redistribution lines. The redistribution structure 900 is shown as an example having six dielectric layers and metallization patterns. Any desired quantity of dielectric layers and metallization patterns may be formed. Additionally, at least some of the dielectric layers are formed of molding compound(s) that have a good buffering ability. Wafer warpage of the redistribution structure 900 caused by shrinkage of those dielectric layers may thus be reduced. In the illustrated embodiment, four dielectric layers (e.g., the dielectric layers 302, 404, 408, and 412) are formed of molding compound(s) and two dielectric layers (e.g., the dielectric layers 602 and 802) are formed of other dielectric materials. Other combinations of dielectric layers may be utilized.

Figure 2:
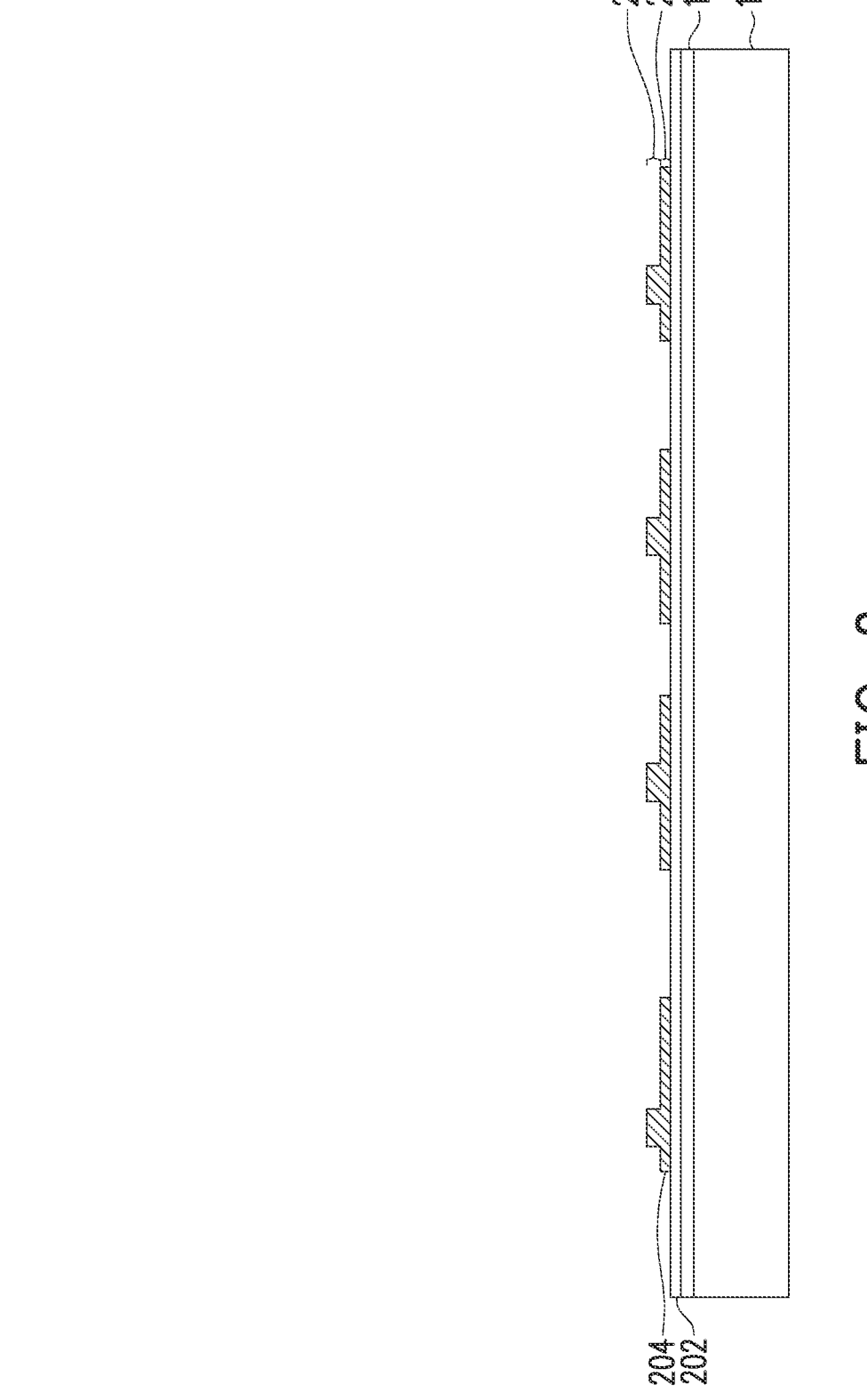

In FIG. 2, a dielectric layer 202 is deposited over the carrier substrate 102, e.g., on the release layer 104. The dielectric layer 202 may be formed of a photosensitive polymer such as polybenzoxazole (PBO), polyimide, low temperature polyimide (LTPI), a benzocyclobutene (BCB) based polymer, or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 202 may be formed by spin coating, lamination, chemical vapor deposition (CVD), or the like.

A metallization pattern 204 is formed on the dielectric layer 202. The metallization pattern 204 includes conductive lines 206 on and extending along the major surface of the dielectric layer 202. The metallization pattern 204 also includes conductive vias 208 on the conductive lines 206.

As an example to form the metallization pattern 204, a seed layer (not separately illustrated) is formed over the dielectric layer 202. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A first photoresist is then formed and patterned on the seed layer. The first photoresist may be formed by spin coating or the like and may be exposed to light for patterning. The pattern of the first photoresist corresponds to the conductive lines 206. The patterning forms openings through the first photoresist to expose the seed layer. A conductive material is then formed in the openings of the first photoresist and on the exposed portions of the seed layer. The conductive material may be formed by plating, such as electroplating or electroless plating, or the like. The conductive material may comprise a metal, like copper, titanium, tungsten, aluminum, or the like. The first photoresist is then removed, such as by an acceptable ashing or stripping process, such as using an oxygen plasma or the like. A second photoresist is then formed and patterned on the seed layer and the conductive lines 206. The second photoresist may be formed by spin coating or the like and may be exposed to light for patterning. The pattern of the second photoresist corresponds to the conductive vias 208. The patterning forms openings through the second photoresist to expose portions of the conductive lines 206. Additional conductive material is then formed in the openings of the second photoresist and on the exposed portions of the conductive lines 206. The additional conductive material may be formed by plating from the conductive lines 206, without forming a seed layer on the conductive lines 206. The second photoresist and portions of the seed layer on which the conductive material is not formed are removed. The second photoresist may be removed by an acceptable ashing or stripping process, such as using an oxygen plasma or the like. Once the second photoresist is removed, exposed portions of the seed layer are removed, such as by using an acceptable etching process, such as by wet or dry etching. The remaining portions of the seed layer and conductive material form the metallization pattern 204.

Figure 3:
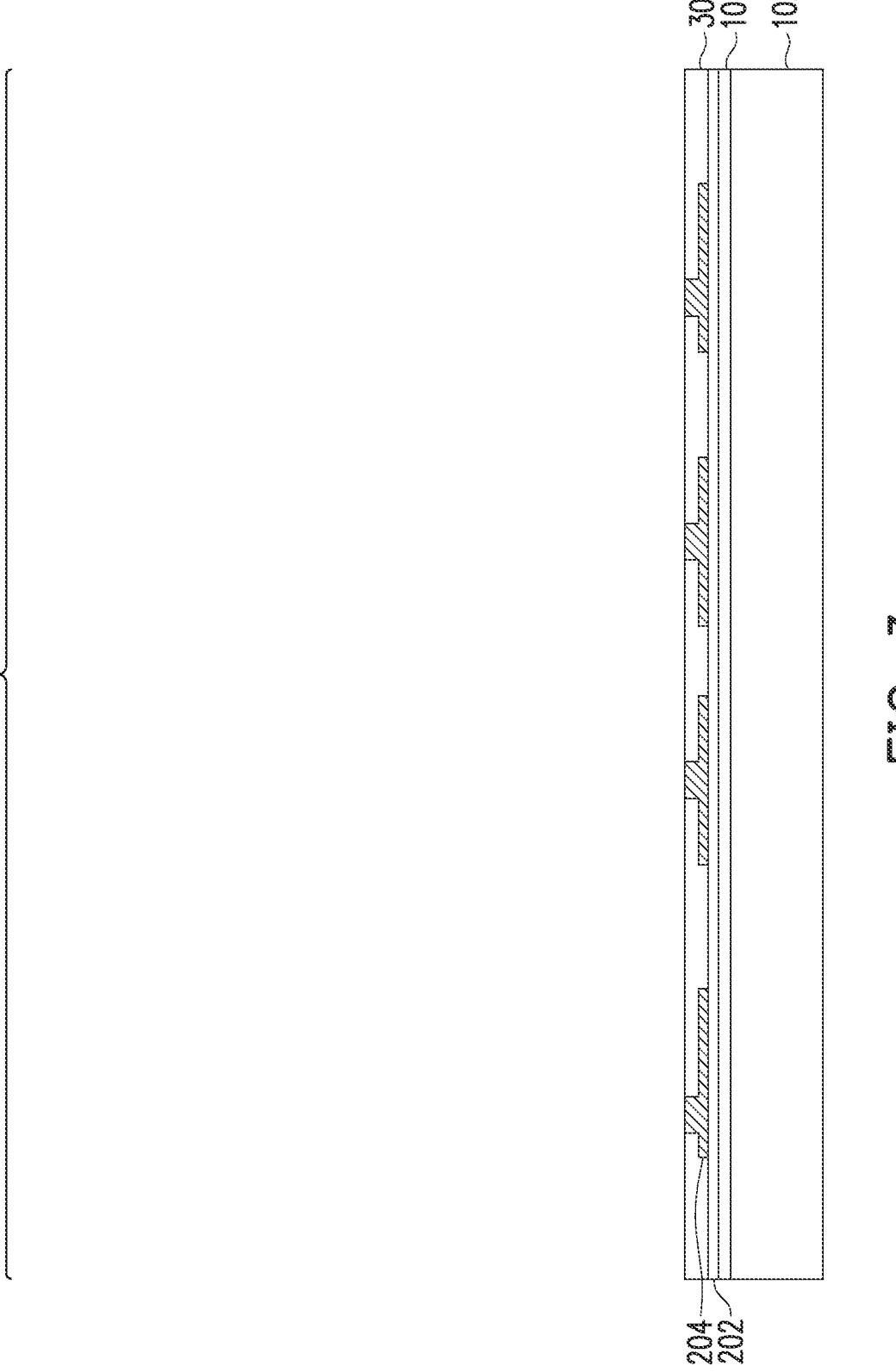

In FIG. 3, a dielectric layer 302 is formed around the metallization pattern 204 and on the dielectric layer 202. The dielectric layer 302 surrounds the metallization pattern 204. In some embodiments, the dielectric layer 302 is formed of a molding compound that is different from the material of the dielectric layer 202. The molding compound may include a resin having fillers disposed therein. Examples of resins include epoxy, acrylic, or polyimide-based materials.

The resin may be a photoinsensitive polymer. Examples of fillers include silica or the like. In some embodiments, an adhesion promoter is formed on the metallization pattern 204 before the dielectric layer 302 is formed, which can increase adhesion of the dielectric layer 302 to the metallization pattern 204. Example adhesion promoters include amine-based, silane-based, thiol-based, or vinyl-based organic materials. The molding compound may be applied by compression molding, transfer molding, or the like, and may be applied in liquid or semi-liquid form and then subsequently cured.

The dielectric layer 302 may be formed over the metallization pattern 204 such that the metallization pattern 204 is buried or covered, and a planarization process is then performed on the dielectric layer 302 to expose the metallization pattern 204 (e.g., the conductive vias 208; see FIG. 2). Upper surfaces of the dielectric layer 302 and the conductive vias 208 are substantially coplanar (within process variations) after the planarization process. The planarization process may be, for example, a chemical-mechanical polish (CMP) or the like.

Figure 4:
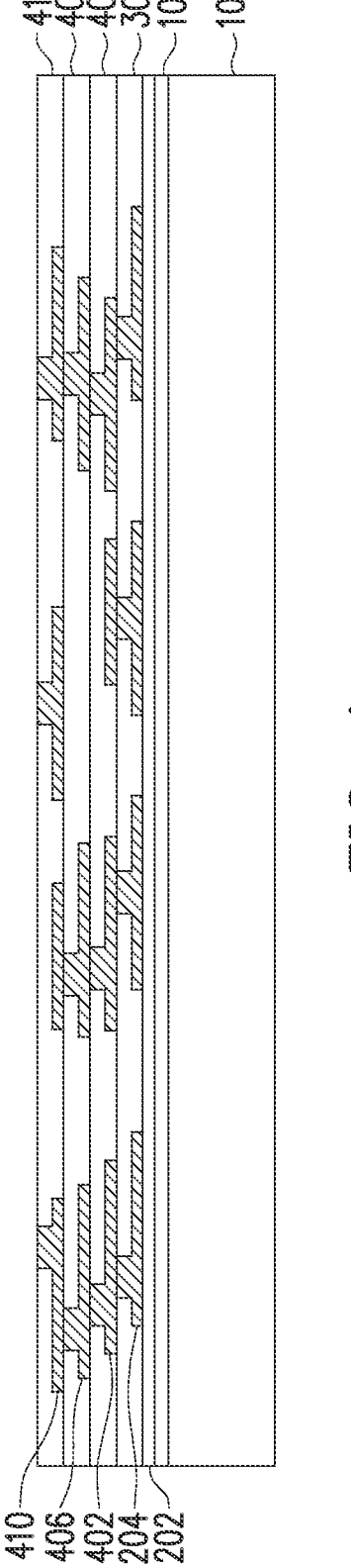

In FIG. 4, the steps and process discussed above are repeated to form metallization patterns 402, 406, and 410 and to form dielectric layers 404, 408, and 412. The metallization patterns 402, 406, and 410 may each be formed of similar materials and by a similar process as the metallization pattern 204. The conductive lines of each metallization pattern are coupled to the respective conductive vias of the respective underlying metallization pattern. The dielectric layers 404, 408, and 412 may each be formed of a similar material (e.g., a molding compound) and by a similar process as the dielectric layer 302.

Figure 5:
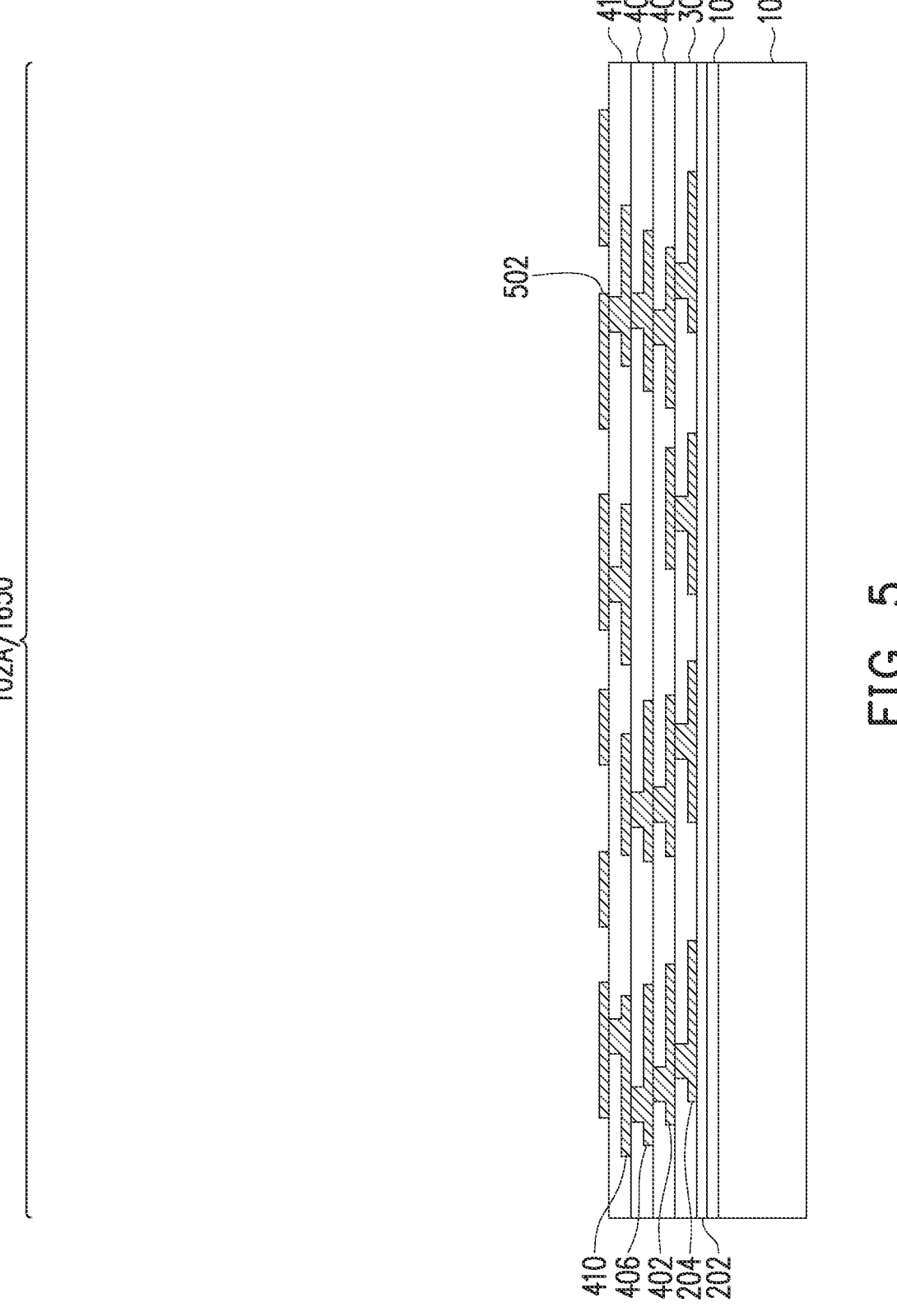

In FIG. 5, a metallization pattern 502 is formed on the dielectric layer 412 and exposed portions (e.g., conductive vias) of the metallization pattern 410. In an embodiment, the metallization pattern 502 may only include conductive lines and may not have conductive vias. As discussed below, a subsequently formed metallization pattern 702 (see FIG. 7) includes conductive vias that will couple the metallization pattern 502, thus obviating the need for conductive vias in the metallization pattern 502 in this embodiment.

As an example to form the metallization pattern 502, a seed layer (not separately illustrated) is formed over the dielectric layer 412 and exposed portions of the metallization pattern 410. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 502. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 502.

Figure 6:
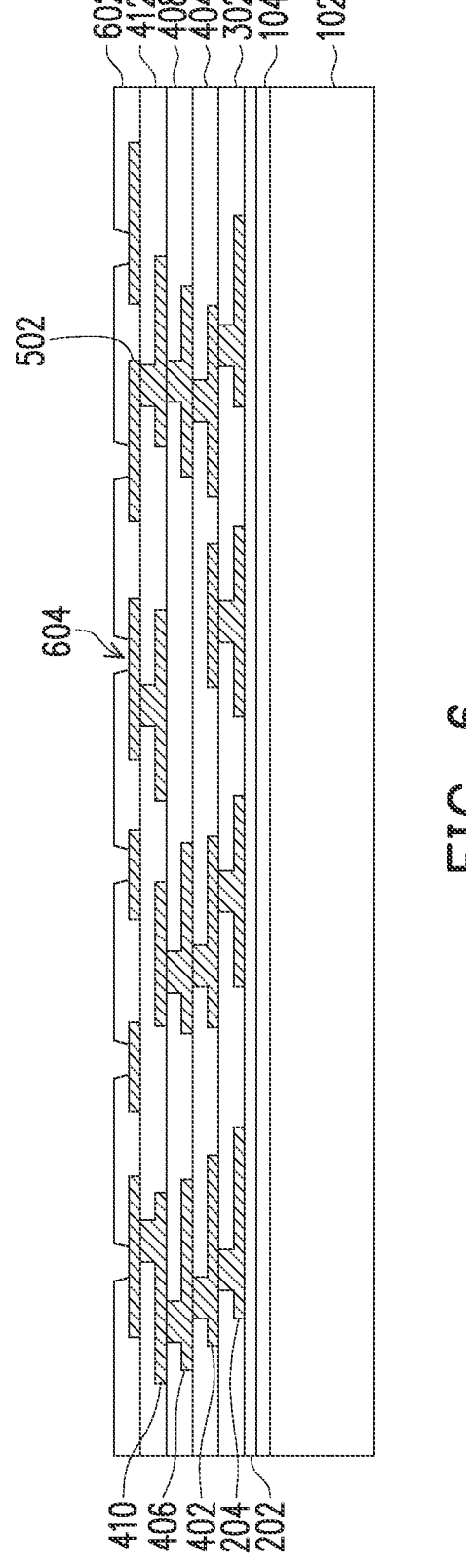

In FIG. 6, a dielectric layer 602 is formed around the metallization pattern 502 and on the dielectric layer 412. After formation, the dielectric layer 602 surrounds and buries or covers the metallization pattern 502. The material of the dielectric layer 602 may be different from the material of the dielectric layers 302, 404, 408, and 412. In some embodiments, the dielectric layer 602 is formed of a photosensitive polymer such as polybenzoxazole (PBO), polyimide, low temperature polyimide (LTPI), a benzocyclobutene (BCB) based polymer, or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 602 may be formed by spin coating, lamination, chemical vapor deposition (CVD), or the like. The dielectric layer 602 may be formed of the same material as the dielectric layer 202.

The dielectric layer 602 is patterned. The patterning forms openings 604 exposing portions of the metallization pattern 502. Because the dielectric layer 602 may be formed of a photosensitive polymer, it can be patterned by photolithography after formation. Planarization of the dielectric layer 602 may thus be avoided, thereby reducing manufacturing costs. The patterning may be by an acceptable process, such as by exposing the dielectric layer 602 to light and then developing the dielectric layer 602 after the exposure or by etching using, for example, an anisotropic etch.

Figure 7:
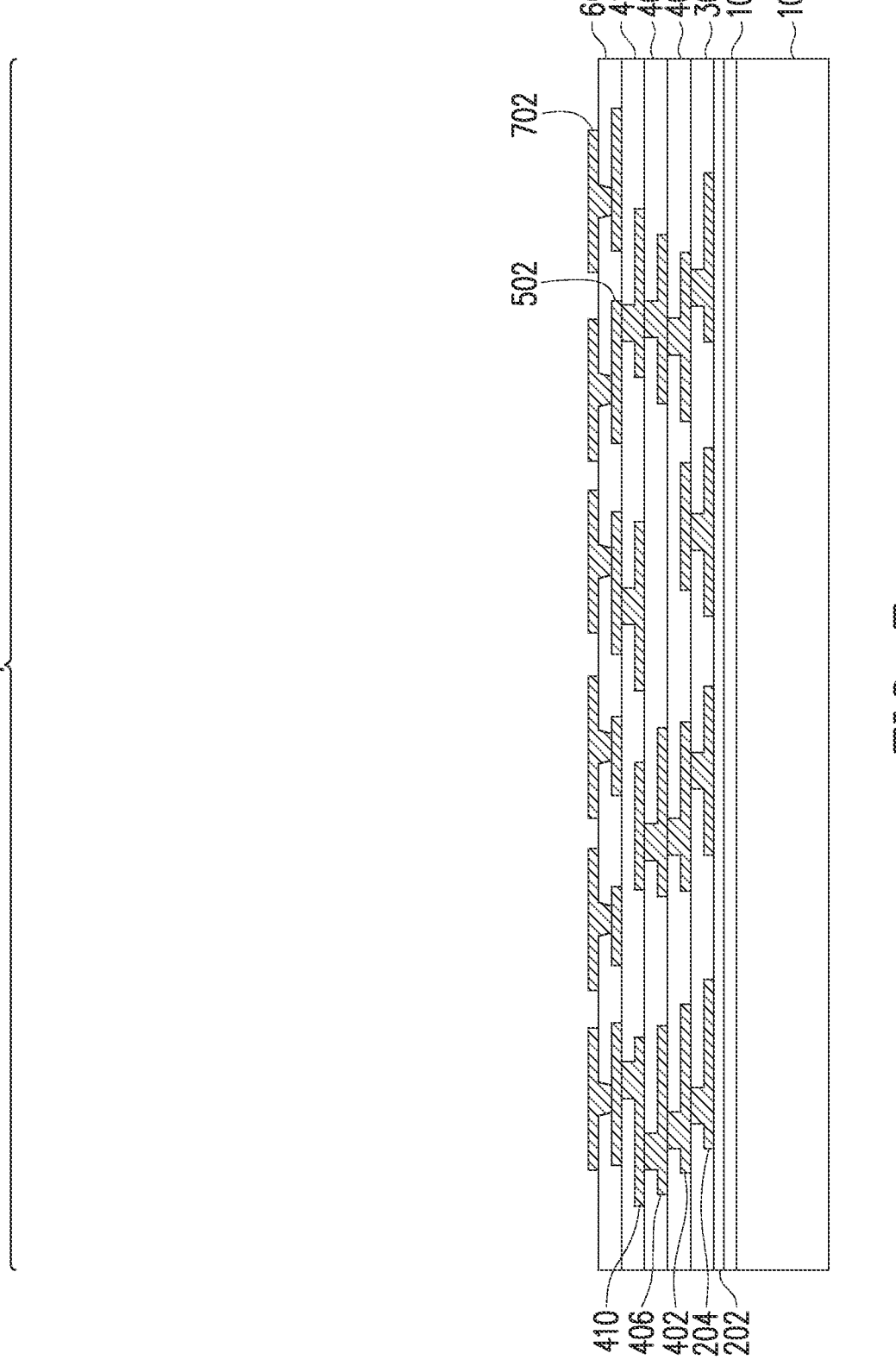

In FIG. 7, a metallization pattern 702 is formed on the dielectric layer 602 and exposed portions of the metallization pattern 502. The metallization pattern 702 includes conductive vias extending through the dielectric layer 602 to physically and electrically couple the metallization pattern 502. The metallization pattern 702 also includes conductive lines on and extending along the major surface of the dielectric layer 602.

As an example to form the metallization pattern 702, a seed layer (not separately illustrated) may be formed over the dielectric layer 602 and in the openings 604 extending through the dielectric layer 602. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 702. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 702.

Figure 8:
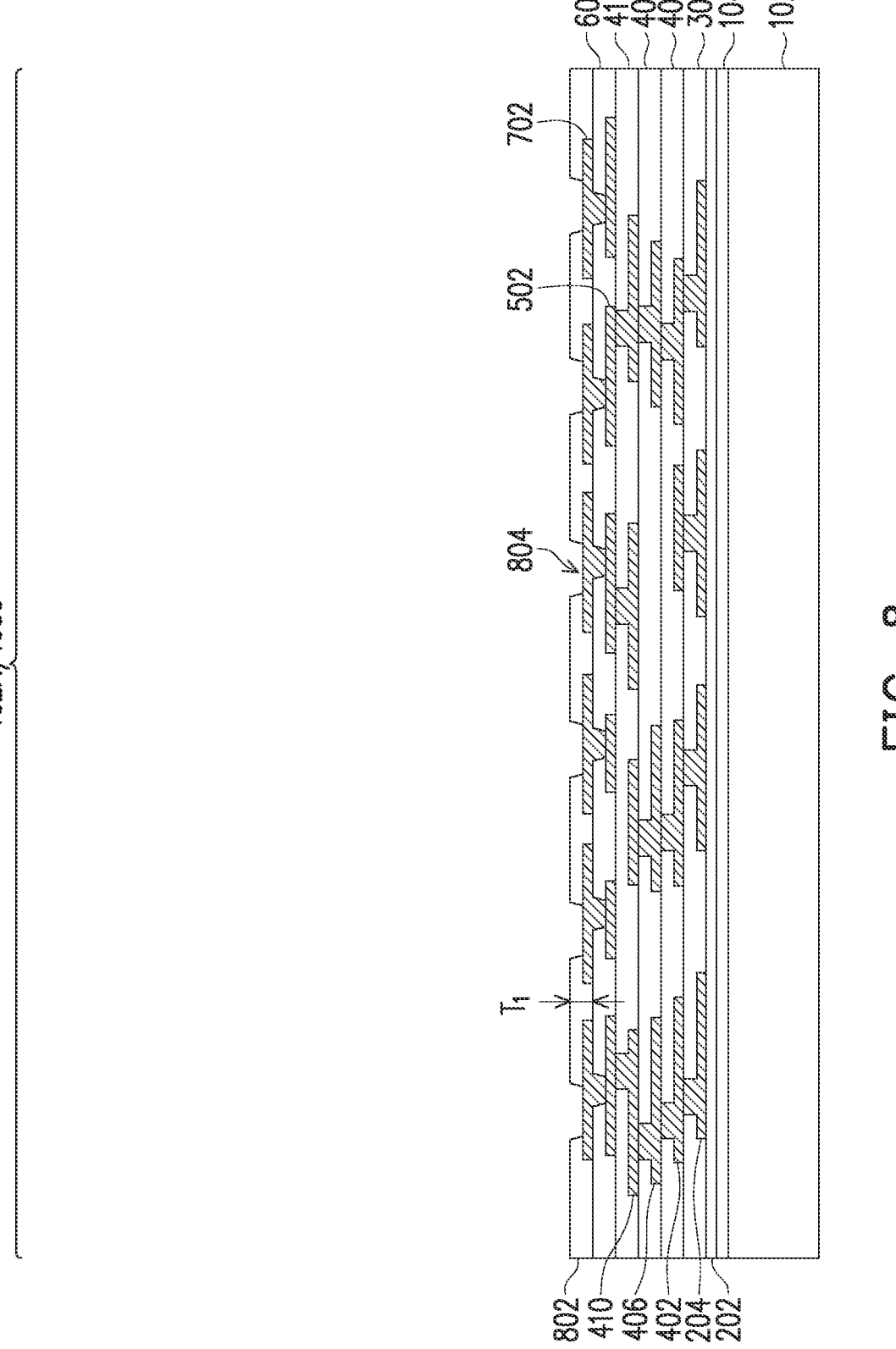

In FIG. 8, a dielectric layer 802 is formed around the conductive lines of the metallization pattern 702 and on the dielectric layer 602. The dielectric layer 802 may be formed of a similar material and in a similar manner as the dielectric layer 602. In an embodiment, the dielectric layer 802 has a thickness $T_1$ in the range of 2 µm to 20 µm. The dielectric layer 802 is patterned to form openings 804 exposing portions of the metallization pattern 702. The patterning may be by a similar process as the process for patterning the dielectric layer 602.

Figure 9:
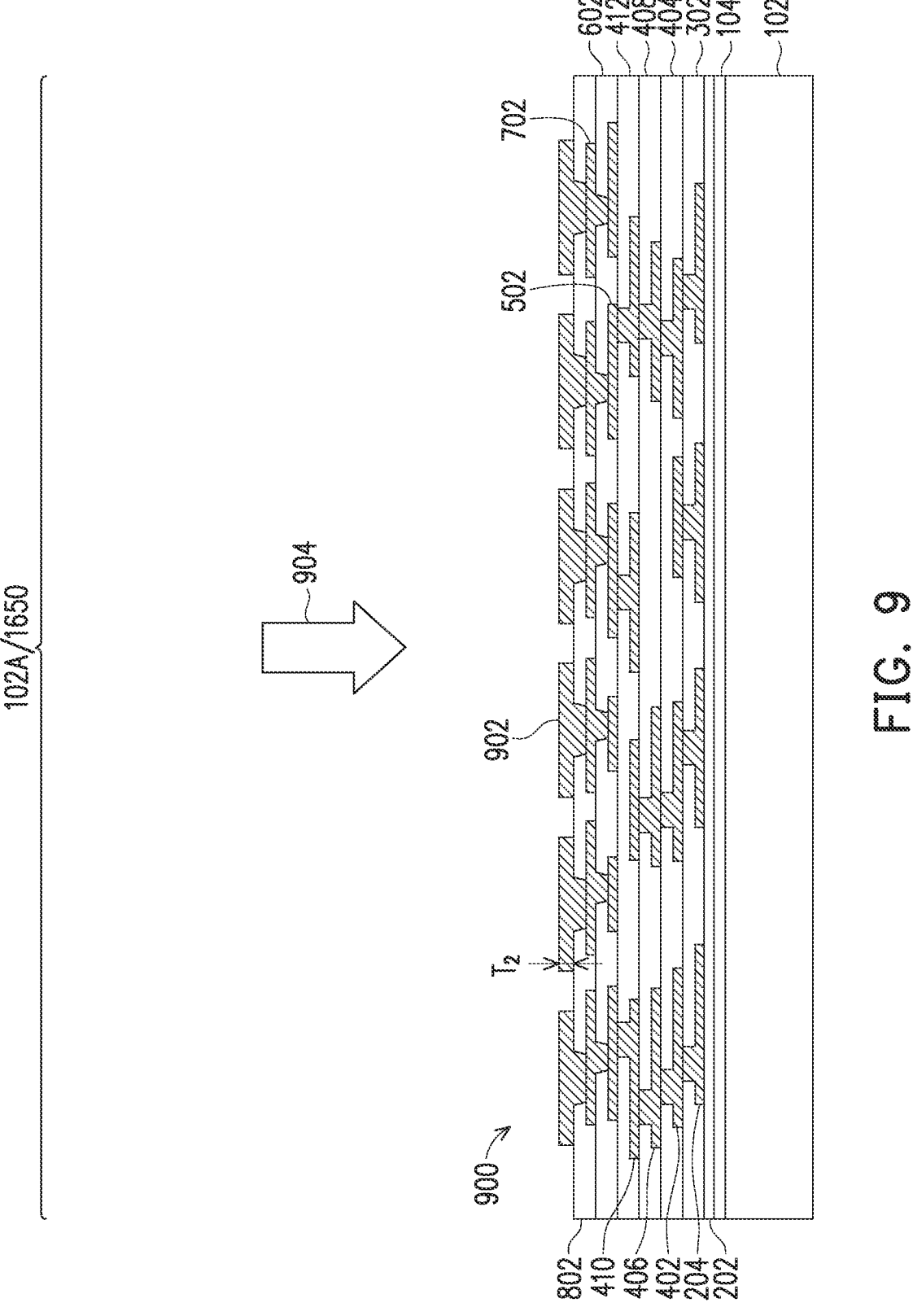

In FIG. 9, under-bump metallizations (UBMs) 902 are formed for external connection. The UBMs 902 include conductive vias extending through the dielectric layer 802 to physically and electrically couple the metallization pattern 702. The UBMs 902 also include conductive bumps on and extending along the major surface of the dielectric layer 802. The UBMs 902 may be formed of a similar material and in a similar manner as the metallization pattern 702. For example, the UBMs 902 may comprise a seed layer (not separately illustrated) and a conductive material on the seed layer. In an embodiment the UBMs 902 may be larger than the metallization pattern 702. The resulting dielectric layers 202, 302, 404, 408, 412, 602, and 802; metallization patterns 204, 402, 406, 410, 502, and 702; and UBMs 902 form the redistribution structure 900. The conductive bumps of the UBMs 902 may have a thickness $T_2$ above the major surface of the dielectric layer 802 in the range of 7 µm to 20 µm.

Additionally, a surface treatment process 904 is performed on a top surface of the upper dielectric layer of the redistribution structure 900. In the illustrated embodiment the dielectric layer 802 is the upper dielectric layer of the redistribution structure 900. In some embodiments, the surface treatment process 904 is performed before the UBMs 902 are formed. In some embodiments, the surface treatment process 904 is performed after the UBMs 902 are formed such that the surface treatment process 904 is also performed on the UBMs 902. The surface treatment process 904 forms dangling bonds on the top surface of the dielectric layer 802. The dangling bonds on the top surface of the dielectric layer 802 may allow for greater bond strength between the dielectric layer 802 and a subsequently formed buffer layer (e.g., buffer layer 1002, discussed in greater detail below for FIG. 10). In some embodiments, the surface treatment process 904 is a plasma treatment process. The plasma treatment process may be performed with precursors that leave behind hydroxyl groups on the treated surface of the dielectric layer 802, such as $O_2$, $N_2$, $H_2$, or a combination thereof. The dangling bonds (e.g., hydroxyl groups) on the treated surface of the dielectric layer 802 may act as additional bonding sites that the subsequently formed buffer layer may bond with. The plasma treatment process may remove some of the material of the dielectric layer 802. As such, the plasma treatment process may be thought of as a combination of a dry etch and a surface hydroxylation. Some residue of the plasma treatment precursors may remain on the treated surface of the dielectric layer 802 after the plasma treatment process.

Figure 10:
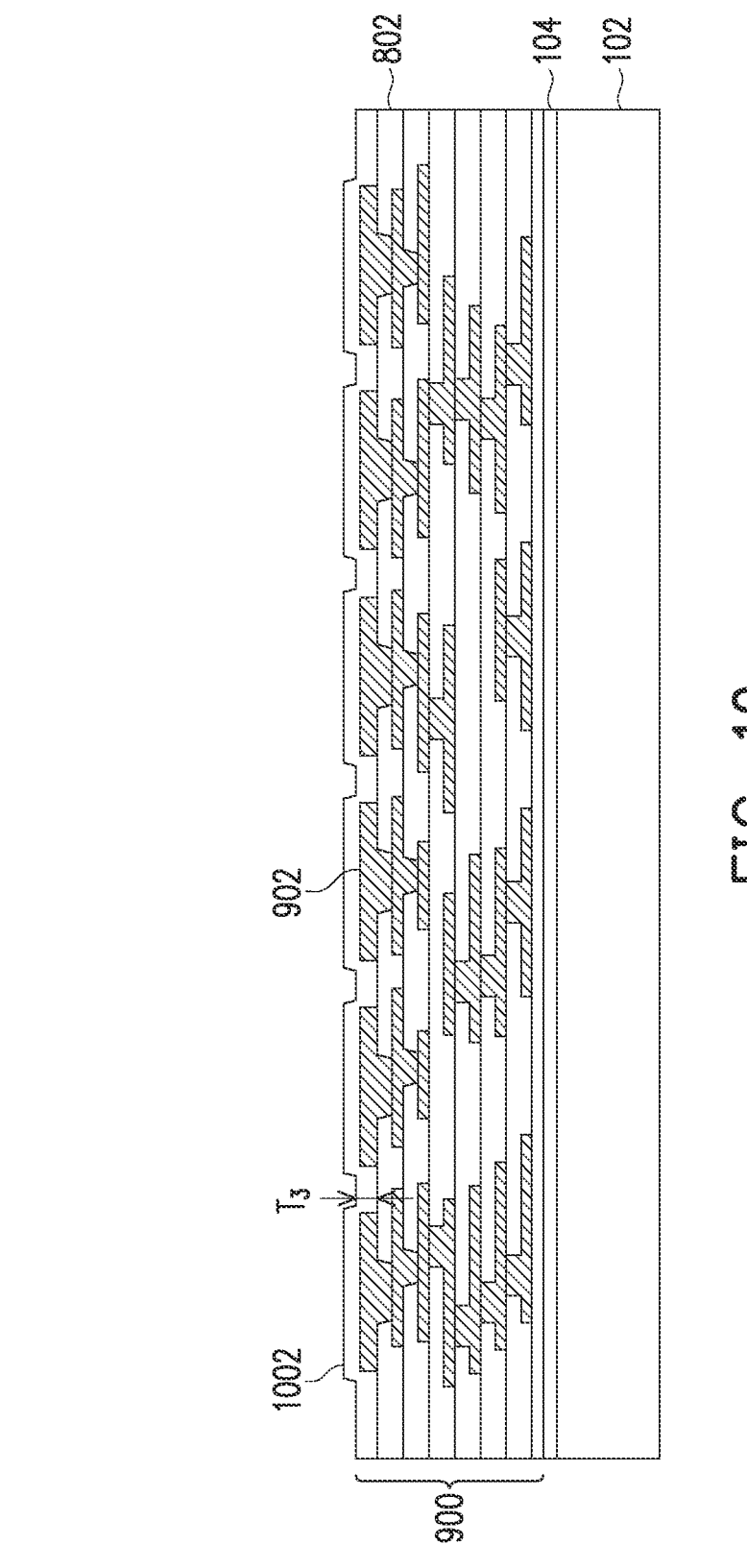

In FIG. 10, a buffer layer 1002 is formed on the redistribution structure 900. Specifically, the buffer layer 1002 is formed around the conductive bumps of the UBMs 902 and on the dielectric layer 802. After formation, the buffer layer 1002 surrounds and buries or covers the conductive bumps of the UBMs 902.

As will be subsequently described in greater detail, an interposer 1200 (see FIG. 12) and a semiconductor device 1600 (see FIG. 16) will be attached to opposing sides of the redistribution structure 900. The redistribution structure 900 fans out electrical connections from the semiconductor device 1600 for electrical coupling to the interposer 1200. Stress is exerted on the redistribution structure 900 during operation or testing as a result of a CTE mismatch between the interposer 1200 and the semiconductor device 1600. The buffer layer 1002 advantageously helps buffers that stress, thereby mitigating the impact of the CTE mismatch between the interposer 1200 and the semiconductor device 1600, which may reduce the risk of the dielectric layer 802 and/or the UBMs 902 cracking under stress. The buffer material of the buffer layer 1002, the thickness of the buffer layer 1002, and/or the process of forming the buffer layer 1002 help improve a buffering ability of the buffer layer 1002.

The buffer material of the buffer layer 1002 may be selected to help it buffer a desired amount of stress. In some embodiments, the buffer layer 1002 is formed of a photosensitive polymer such as polybenzoxazole (PBO), polyimide, low temperature polyimide (LTPI), a benzocyclobutene (BCB) based polymer, or the like. In some embodiments, the buffer layer 1002 is formed of a molding compound, which may include a resin (e.g., epoxy, acrylic, polyimide-based materials, etc.) having fillers (e.g., silica) disposed therein. The buffer layer 1002 may be formed by spin coating, lamination, chemical vapor deposition (CVD), or the like. The buffer material of the buffer layer 1002 may have a small Young's modulus, which may help buffer stress. In some embodiments, the buffer material of the buffer layer 1002 has a Young's modulus in the range of 0.05 GPa to 30 GPa. In some embodiments, the buffer material of the buffer layer 1002 has a CTE in the range of 4 ppm/° C. to 60 ppm/° C.

The thickness of the buffer layer 1002 may be controlled to help it buffer a desired amount of stress. Specifically, the buffer layer 1002 is formed to a large thickness, which may help buffer stress. In some embodiments, the buffer layer 1002 has a thickness $T_3$ in the range of 5 μm to 50 μm. The buffer layer 1002 may have a greater thickness than each of the dielectric layers 202, 302, 404, 408, 412, 602, and 802.

The buffer layer 1002 may be formed by a process that helps it buffer a desired amount of stress. Specifically, forming the buffer layer 1002 includes bonding the buffer material of the buffer layer 1002 to the upper dielectric layer of the redistribution structure 900 (e.g., the dielectric layer 802). As a result, the bonding strength of the interface between the dielectric layer 802 and the buffer layer 1002 may be improved so that the interface between the dielectric layer 802 and the buffer layer 1002 is capable of withstanding a larger force. Improving the bonding strength of the interface between the dielectric layer 802 and the buffer layer 1002 may reduce the chances of interface delamination when the buffer layer 1002 buffers stress. As noted above, the surface treatment process 904 (see FIG. 9) creates dangling bonds (e.g., hydroxyl groups) on the treated surface of the dielectric layer 802. The buffer layer 1002 may be bonded to the dielectric layer 802 by reacting the buffer material of the buffer layer 1002 with the dangling bonds on the top surface of the dielectric layer 802 to form covalent bonds between the material of the dielectric layer 802 and the buffer material of the buffer layer 1002. For example, the buffer material of the buffer layer 1002 may be cured after it is deposited, which reacts the buffer material of the buffer layer 1002 with the dangling bonds. The curing may be by a suitable annealing process. In an embodiment, the buffer layer 1002 is formed from the same material as the dielectric layer 802 and the bonding strength at the interface between the buffer layer 1002 and the dielectric layer 802 following the surface treatment process 904 is greater than the bonding strength at the interface between two middle dielectric layers of the same material (e.g., dielectric layers 602 and 802) that did not experience the surface treatment process 904 prior to the interface between the two dielectric layers of the same material being formed.

Figure 11:
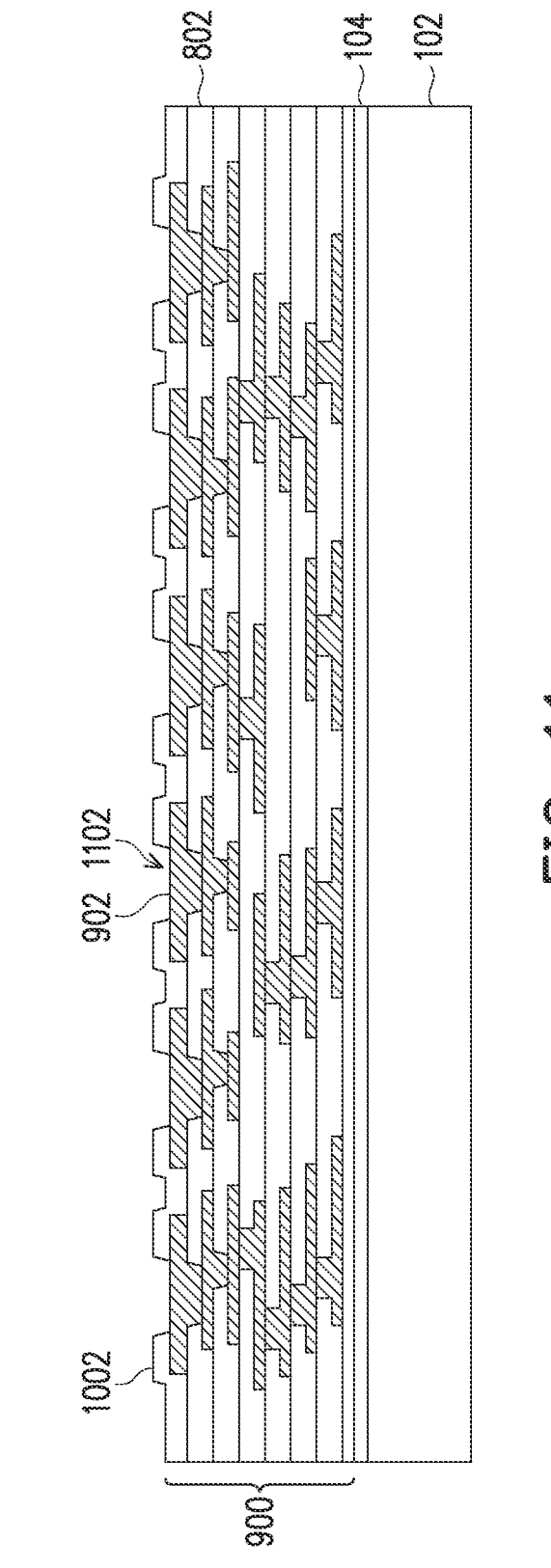

In FIG. 11, the buffer layer 1002 is patterned with openings 1102 exposing portions of the conductive bumps of the UBMs 902. In some embodiments where the buffer layer 1002 is formed of a photosensitive polymer, the buffer layer 1002 may be patterned by exposing the buffer layer 1002 to light and then developing the buffer layer 1002. In some embodiments where the buffer layer 1002 is formed of a molding compound, the buffer layer 1002 may be patterned by drilling the openings 1102 with laser drilling or the like. In an embodiment, after the patterning of the buffer layer 1002, only portions of the conductive bumps of the UBMs 902 are exposed, with a top surface of the dielectric layer 802 being completely covered.

Figure 12:
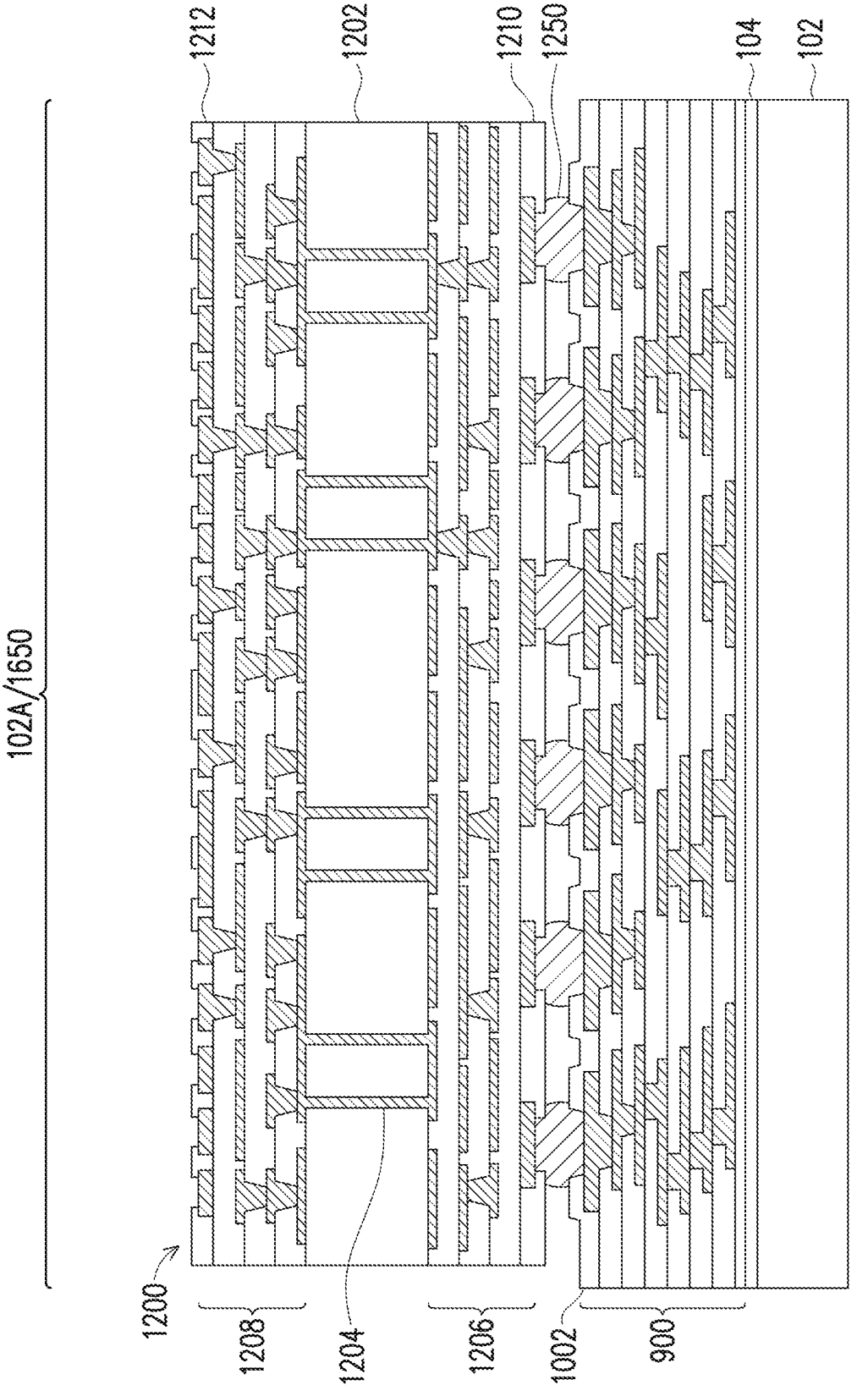

In FIG. 12, conductive connectors 1250 are formed on the exposed portions of the UBMs 902 in the openings 1102. The conductive connectors 1250 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 1250 may include a conductive material such as solder, copper, aluminum, gold, nickel, silver, palladium, tin, the like, or a combination thereof. In some embodiments, the conductive connectors 1250 are formed by initially forming a layer of a reflowable material (e.g., solder) through evaporation, electroplating, printing, solder transfer, ball placement, or the like. Once a layer of solder has been formed on the structure, a reflow may be performed in order to shape the material into the desired bump shapes.

An interposer 1200 is attached to the redistribution structure 900. The interposer 1200 may be, e.g., an organic substrate, a ceramic substrate, a silicon substrate, or the like. The conductive connectors 1250 are used to attach the interposer 1200 to the redistribution structure 900. Attaching the interposer 1200 may include placing the interposer 1200 on the redistribution structure 900 and reflowing the conductive connectors 1250 to physically and electrically couple the interposer 1200 to the redistribution structure 900. The interposer 1200 may be placed on the redistribution structure 900 using a suitable pick-and-place technique.

Before being attached to the redistribution structure 900, the interposer 1200 may be processed according to applicable manufacturing processes to form redistribution structures in the interposer 1200. For example, the interposer 1200 includes a substrate core 1202. The substrate core 1202 may be formed of glass fiber, resin, filler, other materials, and/or combinations thereof. The substrate core 1202 may be formed of organic and/or inorganic materials. In some embodiments, the substrate core 1202 includes one or more passive components (not separately illustrated) embedded inside. Alternatively, the substrate core 1202 may comprise other materials or components. Conductive vias 1204 are formed extending through the substrate core 1202. The conductive vias 1204 comprise a conductive material such as copper, a copper alloy, or other conductors, and may include a barrier layer, liner, seed layer, and/or a fill material, in some embodiments. The conductive vias 1204 provide vertical electrical connections from one side of the substrate core 1202 to the other side of the substrate core 1202. Holes for the conductive vias 1204 may be formed using a drilling process, photolithography techniques, a laser process, or other methods, as examples, and the holes of the conductive vias 1204 are then filled with conductive material. In some embodiments, the conductive vias 1204 are hollow conductive through vias having centers that are filled with an insulating material. Redistribution structures 1206 and 1208 are formed on opposing sides of the substrate core 1202. The redistribution structures 1206 and 1208 are electrically coupled by the conductive vias 1204, and fan-out electrical signals. The redistribution structures 1206 and 1208 each include dielectric layers and metallization patterns. Each respective metallization pattern has line portions on and extend along the major surface of a respective dielectric layer, and has via portions extending through the respective dielectric layer.

In some embodiments, the interposer 1200 further comprises a solder resist 1210 disposed on an outer surface of a dielectric layer of the redistribution structure 1206, which is opposite the substrate core 1202. The solder resist 1210 may provide additional protection to the features of the redistribution structure 1206. The solder resist 1210 may be formed of a polymer material such as an epoxy, which may be formed by a suitable printing process. The solder resist 1210 has a pattern of openings exposing portions of the metallization patterns of the redistribution structure 1206. In an embodiment, the solder resist 1210 is formed using a selective formation method such as inkjet printing, in which the solder resist 1210 is selectively sprayed to form the pattern of openings. The conductive connectors 1250 extend through the openings in the solder resist 1210 and are coupled to the metallization patterns of the redistribution structure 1206. As such, the conductive connectors 1250 electrically couple the redistribution structure 900 to the interposer 1200. In an embodiment, the solder resist 1210 is formed from a different material than the buffer layer 1002.

The interposer 1200 may also further comprise a solder resist 1212 disposed on an outer surface of a dielectric layer of the redistribution structure 1208, which is opposite the substrate core 1202. The solder resist 1212 may be similar to the solder resist 1210. The solder resist 1212 has a pattern of openings exposing portions of the metallization patterns of the redistribution structure 1208.

The interposer 1200 has a large CTE and/or a large Young's modulus. In an embodiment, the interposer 1200 has a CTE in the range of 5 ppm/° C. to 20 ppm/° C. In an embodiment, the interposer 1200 has a Young's modulus in the range of 5 GPa to 50 GPa. In an embodiment, the Young's modulus of the interposer 1200 is greater than the Young's modulus of the buffer layer 1002.

Figure 13:
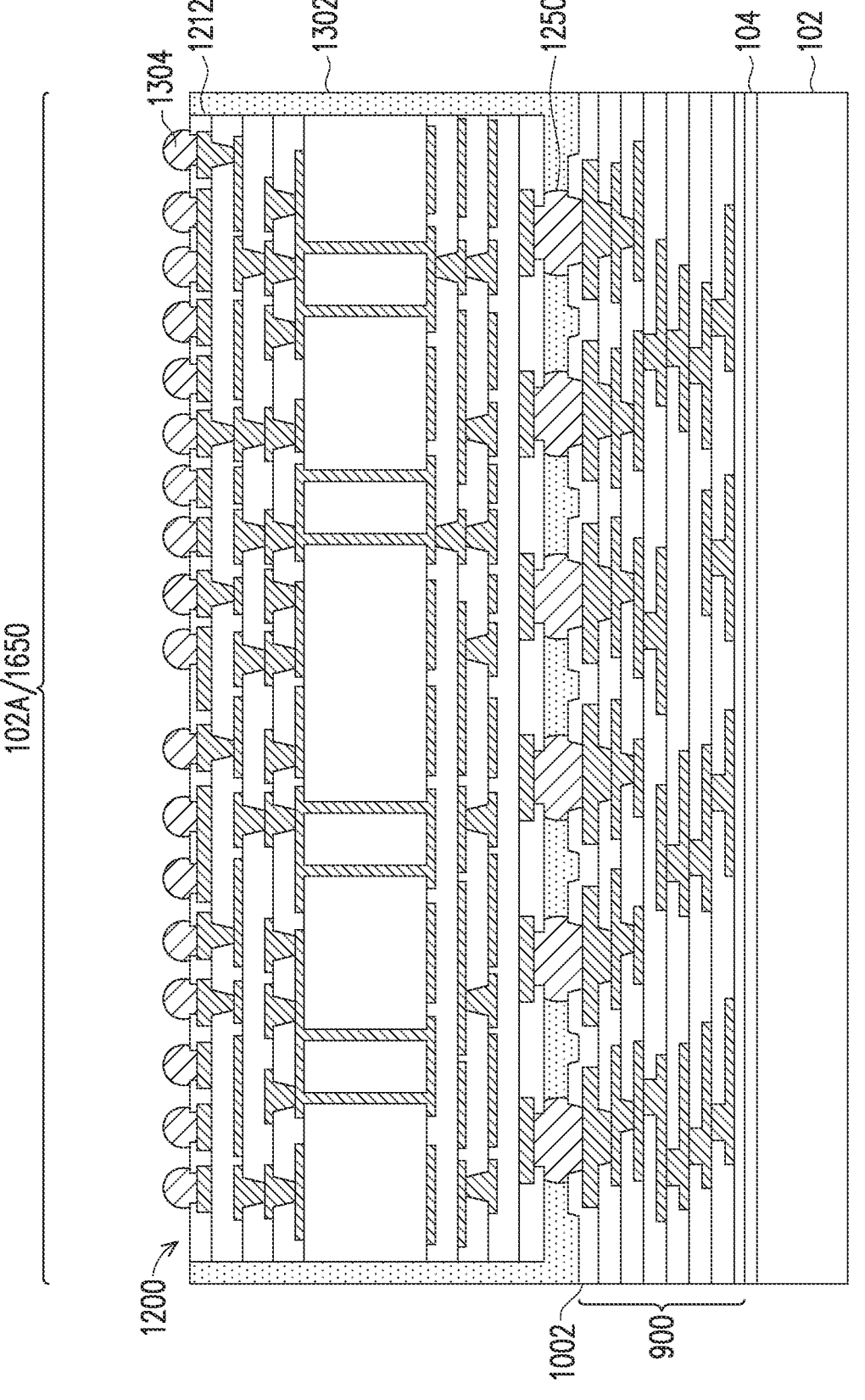

In FIG. 13, an encapsulant 1302 is formed surrounding the conductive connectors 1250 and the interposer 1200. The encapsulant 1302 may serve as an underfill, the underfill may reduce stress and protect the joints resulting from the reflowing of the conductive connectors 1250. The encapsulant 1302 may be formed of a suitable molding compound, which may be formed by a capillary flow process after the interposer 1200 is attached to the redistribution structure 900, or may be formed by a suitable deposition method before the interposer 1200 is attached to the redistribution structure 900. The encapsulant 1302 may be formed along sidewalls of the interposer 1200. In an embodiment, the encapsulant 1302 is formed from a different material than the buffer layer 1002. The buffer layer 1002 may physically separate the UBMs 902 of the redistribution structure 900 from the encapsulant 1302.

In an embodiment the encapsulant 1302 may be formed over the interposer 1200 such that the interposer 1200 is buried or covered. A removal process may be performed on the encapsulant 1302 to expose the interposer 1200 (e.g., an outer surface of the solder resist 1212). The removal process may be, for example, a chemical-mechanical polish (CMP) or the like.

Conductive connectors 1304 are formed in the openings in the solder resist 1212. The conductive connectors 1304 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 1304 may include a conductive material such as solder, copper, aluminum, gold, nickel, silver, palladium, tin, the like, or a combination thereof. In some embodiments, the conductive connectors 1304 are formed by initially forming a layer of solder through evaporation, electroplating, printing, solder transfer, ball placement, or the like. The conductive connectors 1304 are external connectors for attaching the integrated circuit package 1650 to other structures, such as a motherboard, printed circuit board, or the like.

Figure 14:
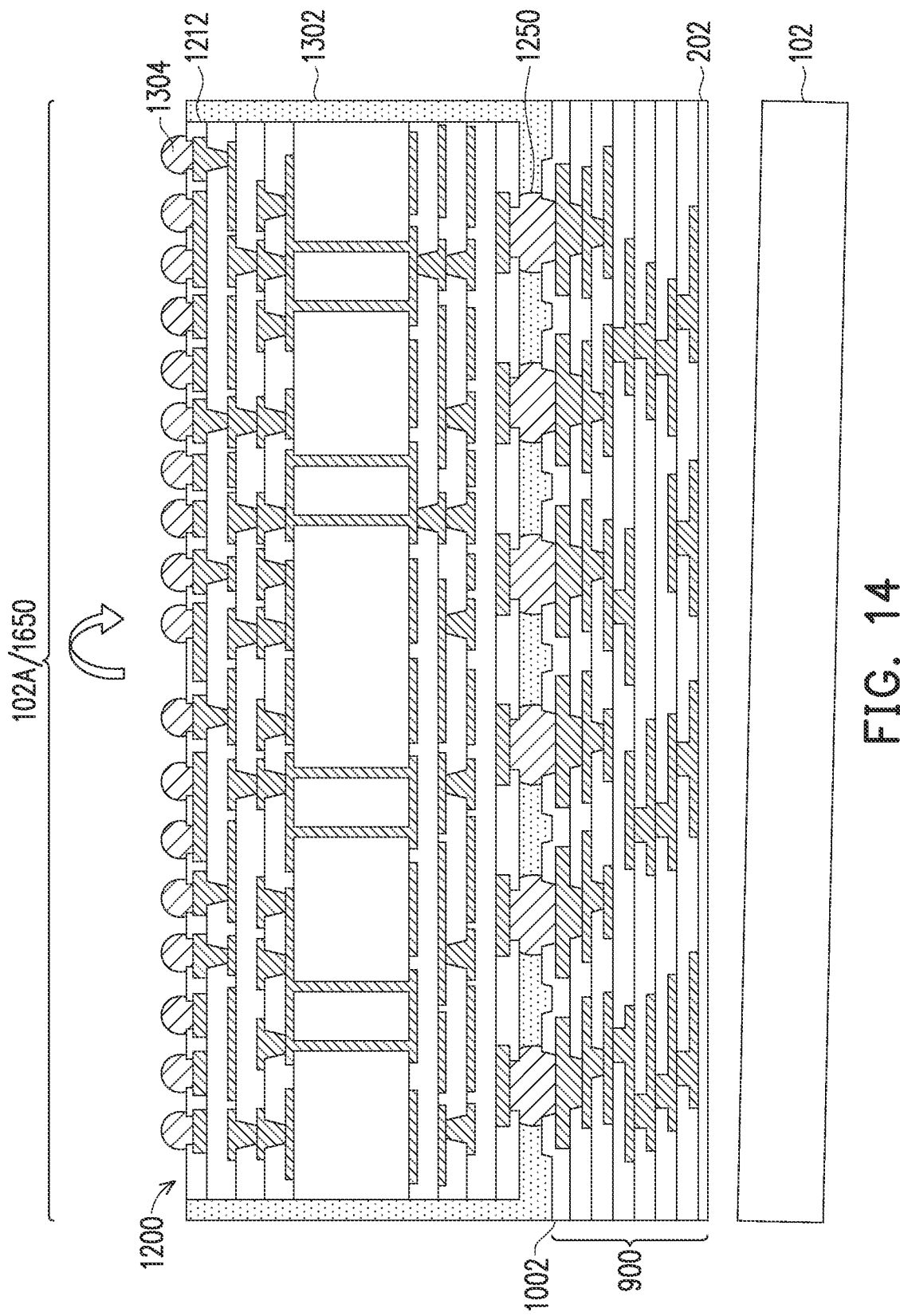

In FIG. 14, a carrier substrate de-bonding is performed to detach (or "de-bond") the carrier substrate 102 from the redistribution structure 900, e.g., from the dielectric layer 202. In accordance with some embodiments, the de-bonding includes projecting a light such as a laser light or an UV light on the release layer 104 so that the release layer 104 decomposes under the heat of the light and the carrier substrate 102 can be removed. Removing the carrier substrate 102 exposes a bottom dielectric layer (e.g. dielectric layer 202) of the redistribution structure 900. The structure is then flipped over and placed on a tape.

Figure 15:
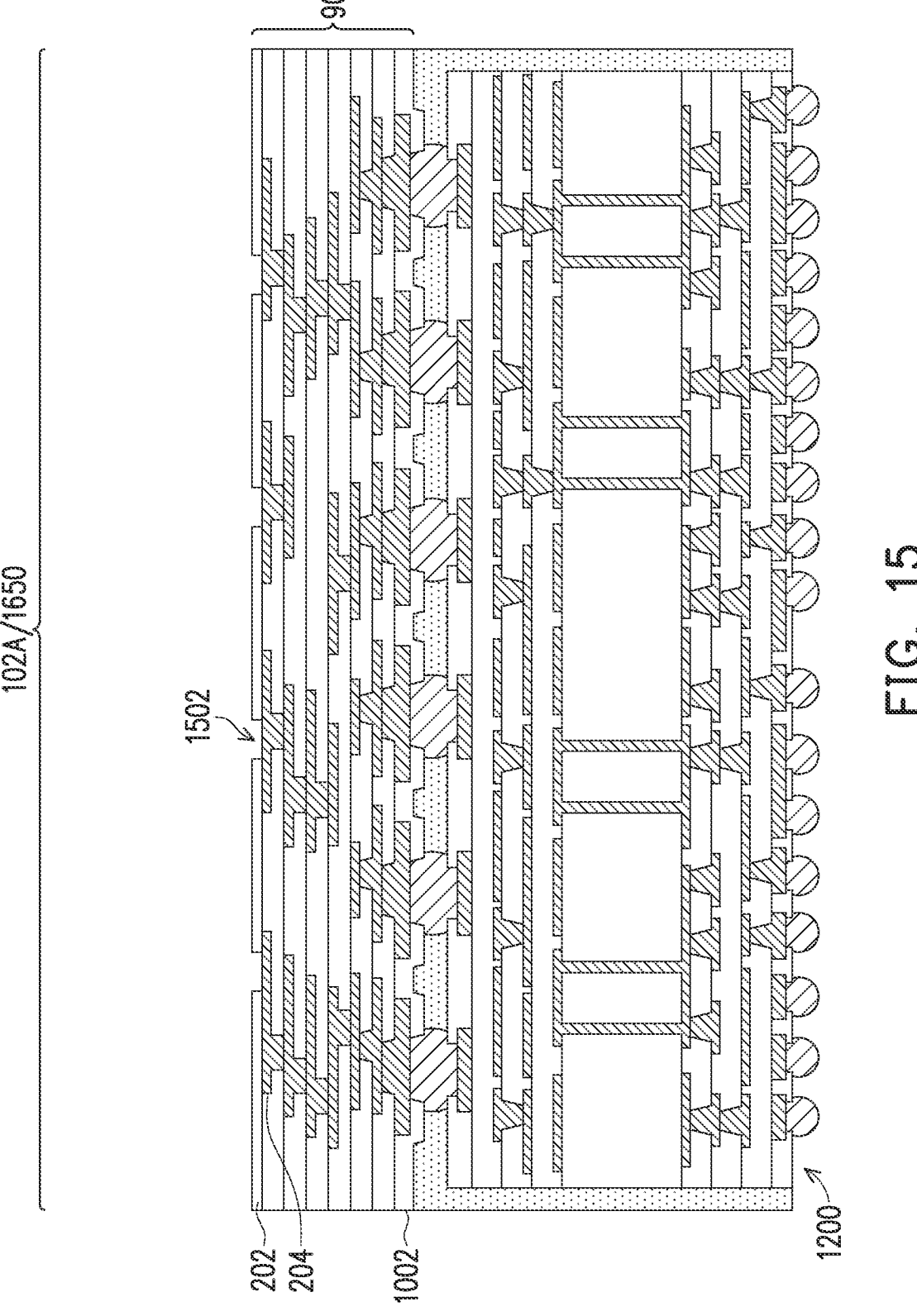

In FIG. 15, openings 1502 are formed in the dielectric layer 202, exposing portions of the metallization pattern 204. In an embodiment the openings 1502 may be formed by a drilling process such as laser drilling, mechanical drilling, or the like.

Figure 16:
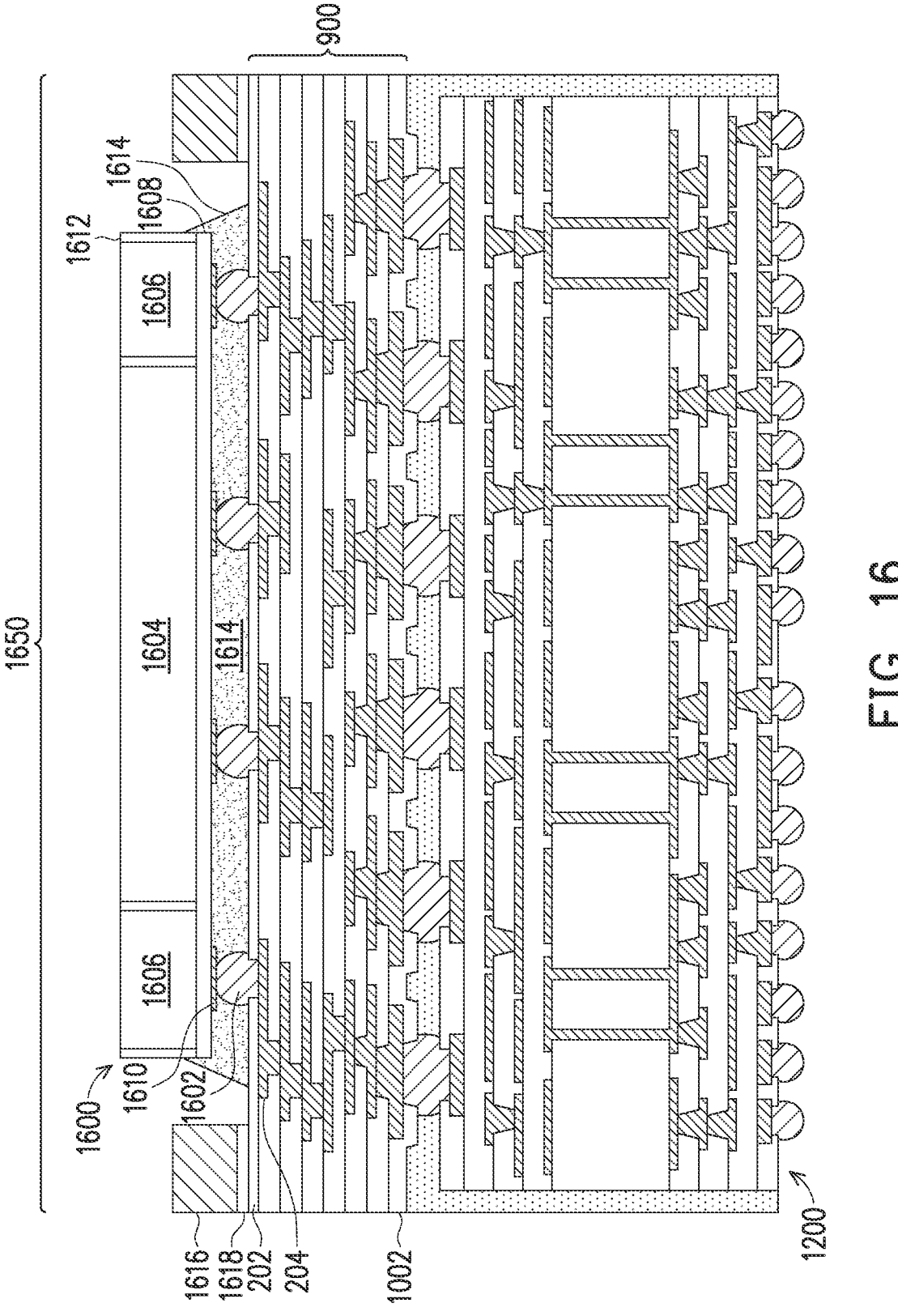

In FIG. 16, conductive connectors 1602 are formed in the openings 1502, physically and electrically coupled to the exposed metallization pattern 204. The conductive connectors 1602 may be ball grid array (BGA) connectors, solder balls, metal pillars, controlled collapse chip connection (C4) bumps, micro bumps, or the like. The conductive connectors 1602 may include a conductive material such as solder, copper, aluminum, gold, nickel, silver, palladium, tin, the like, or a combination thereof. In some embodiments, the conductive connectors 1602 are formed by initially forming a layer of reflowable material in the openings 1502 through evaporation, electroplating, printing, solder transfer, ball placement, or the like.

A semiconductor device 1600 is attached to the redistribution structure 900, opposite the interposer 1200. The conductive connectors 1602 are used to attach the semiconductor device 1600 to the redistribution structure 900. Attaching the semiconductor device 1600 may include placing the semiconductor device 1600 on the interposer 1200 and reflowing the conductive connectors 1602 to physically and electrically couple the semiconductor device 1600 to the interposer 1200. The semiconductor device 1600 may be placed on the conductive connectors 1250 using a suitable pick-and-place technique.

In this embodiment, the semiconductor device 1600 is a package that includes one or more integrated circuit dies for forming a computing system. In the embodiment shown, the semiconductor device 1600 includes a logic die 1604 and memory devices 1606. The logic die 1604 may be, e.g., a central processing unit (CPU), graphics processing unit (GPU), system-on-a-chip (SoC), application processor (AP), microcontroller, or the like. The memory devices 1606 may be, e.g., dynamic random access memory (DRAM) dies, static random access memory (SRAM) dies, hybrid memory cube (HMC) devices, high bandwidth memory (HBM) devices, or the like. The logic die 1604 and memory devices 1606 are attached to and interconnected by a redistribution structure 1608. The redistribution structure 1608 may be, e.g., an interposer or the like, and has connectors 1610 for external connection. An encapsulant 1612 may be formed over the redistribution structure 1608 and around the logic die 1604 and memory devices 1606, thereby protecting the various components of the semiconductor device 1600. In another embodiment (subsequently described for FIG. 17), the semiconductor device 1600 is a semiconductor die.

In some embodiments, an underfill 1614 is formed surrounding the conductive connectors 1602. The underfill 1614 may reduce stress and protect the joints resulting from the reflowing of the conductive connectors 1602. The underfill 1614 may be formed by a capillary flow process after the semiconductor device 1600 is attached to the redistribution structure 900, or may be formed by a suitable deposition method before the semiconductor device 1600 is attached to the redistribution structure 900.

The semiconductor device 1600 has a small CTE. In an embodiment, the semiconductor device 1600 has a CTE in the range of 2 ppm/° C. to 6 ppm/° C. As previously noted, the interposer 1200 has a large CTE. As a result, there is a mismatch in CTE between the semiconductor device 1600 and the interposer 1200. In some embodiments, the mismatch in CTE between the semiconductor device 1600 and the interposer 1200 is in the range of 4 ppm/° C. to 18 ppm/° C. The CTE mismatch between the semiconductor device 1600 and the interposer 1200 results in stress being induced on the redistribution structure 900 during operation or testing. The edges of the UBMs 902 along the major surface of the dielectric layer 802 are particularly susceptible to cracking under stress, and those cracks are capable of propagating into the dielectric layer 802. The buffer layer 1002 helps mitigate stress at the edges of the UBMs 902 along the major surface of the dielectric layer 802, thereby reducing the risk of cracks forming in the redistribution structure 900 when the redistribution structure 900 is under stress. In an embodiment, the buffer layer 1002 completely covers the edges of the UBMs 902 along the major surface of the dielectric layer 802, thereby protecting the edges of the UBMs 902.

In FIG. 16, a singulation process is performed by sawing along scribe line regions, e.g., around the first package region 120A. The sawing singulates the first package region 120A from adjacent package regions. The resulting, singulated integrated circuit package 1650 is from the first package region 120A.

Optionally, a support ring 1616 is attached to the redistribution structure 900, such that the support ring 1616 encircles the semiconductor device 1600. The support ring 1616 may be formed of a material with high thermal conductivity, such as a metal, such as copper, steel, iron, or the like. The support ring 1616 provides mechanical reinforcement for the integrated circuit package 1650, and may help reduce warpage of the integrated circuit package 1650. The support ring 1616 may be attached to the redistribution structure 900 through the use of an adhesive 1618. The adhesive 1618 may be dispensed in a ring shape encircling the semiconductor device 1600, or may be dispensed as discrete portions aligned to the support ring 1616.

Figure 17:
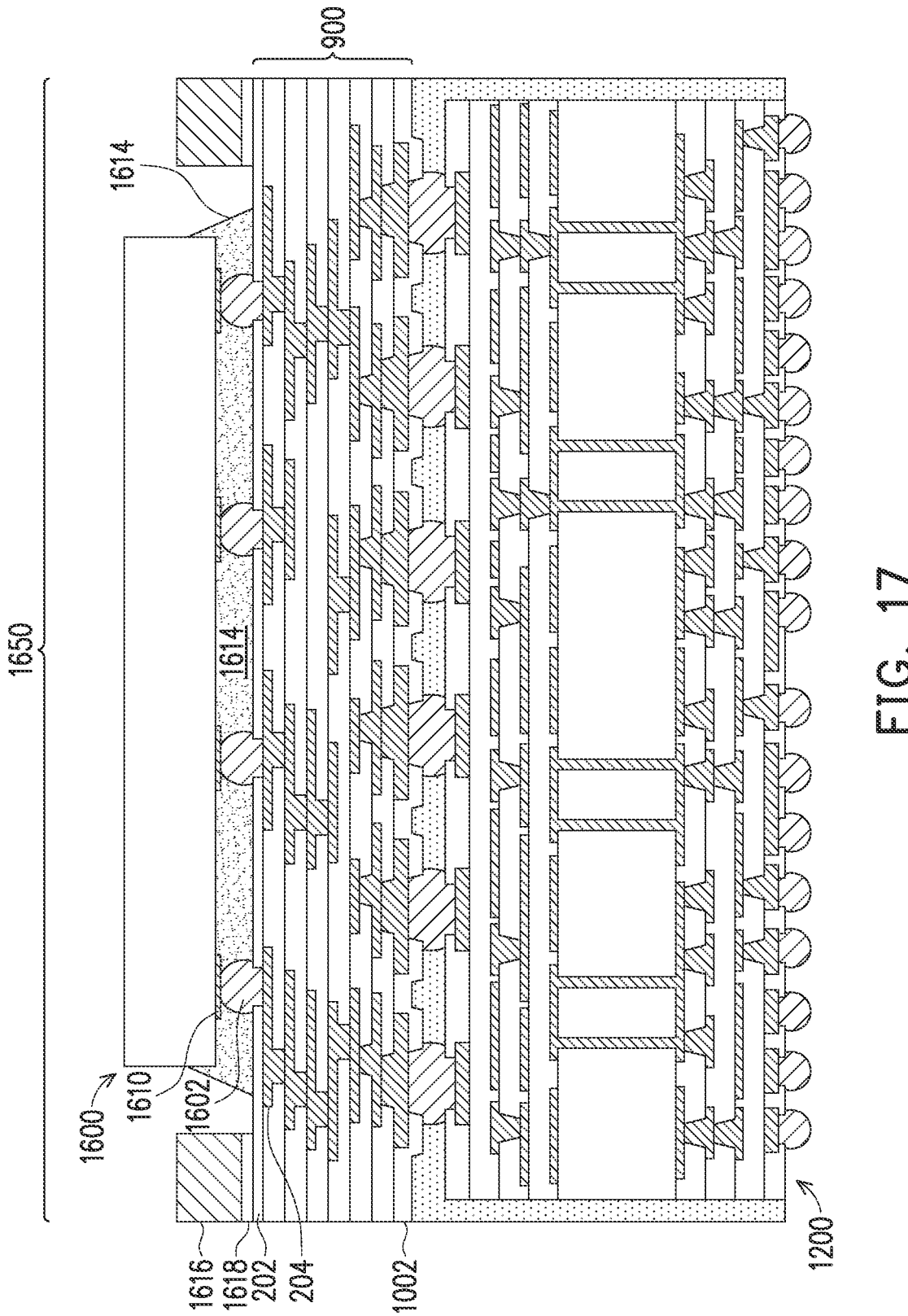
FIG. 17 is a cross-sectional view of an integrated circuit package, in accordance with some other embodiments.

FIG. 17 is a cross-sectional view of an integrated circuit package 1650, in accordance with some other embodiments. This embodiment is similar to the embodiment of FIG. 16, except the semiconductor device 1600 is a semiconductor die (or chip). As a result, the semiconductor device 1600 may not include an encapsulant or a redistribution structure. The semiconductor die may have connectors 1610 for external connection. The conductive connectors 1602 attach the connectors 1610 of the semiconductor device 1600 to the metallization pattern 204 of the redistribution structure 900.

Figure 18:
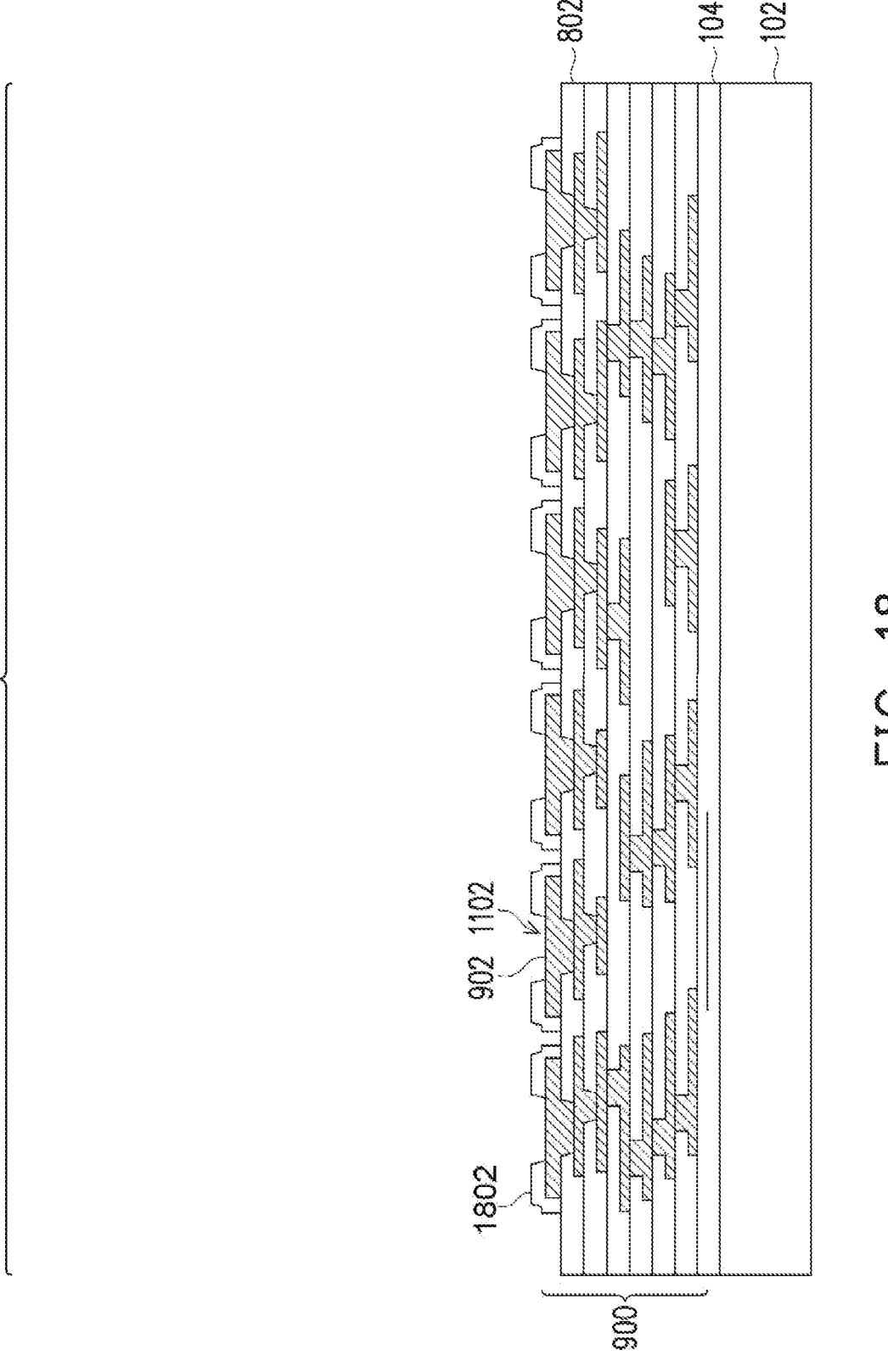
FIG. 18-19 are cross-sectional views of an integrated circuit package, in accordance with some other embodiments.
Figure 19:
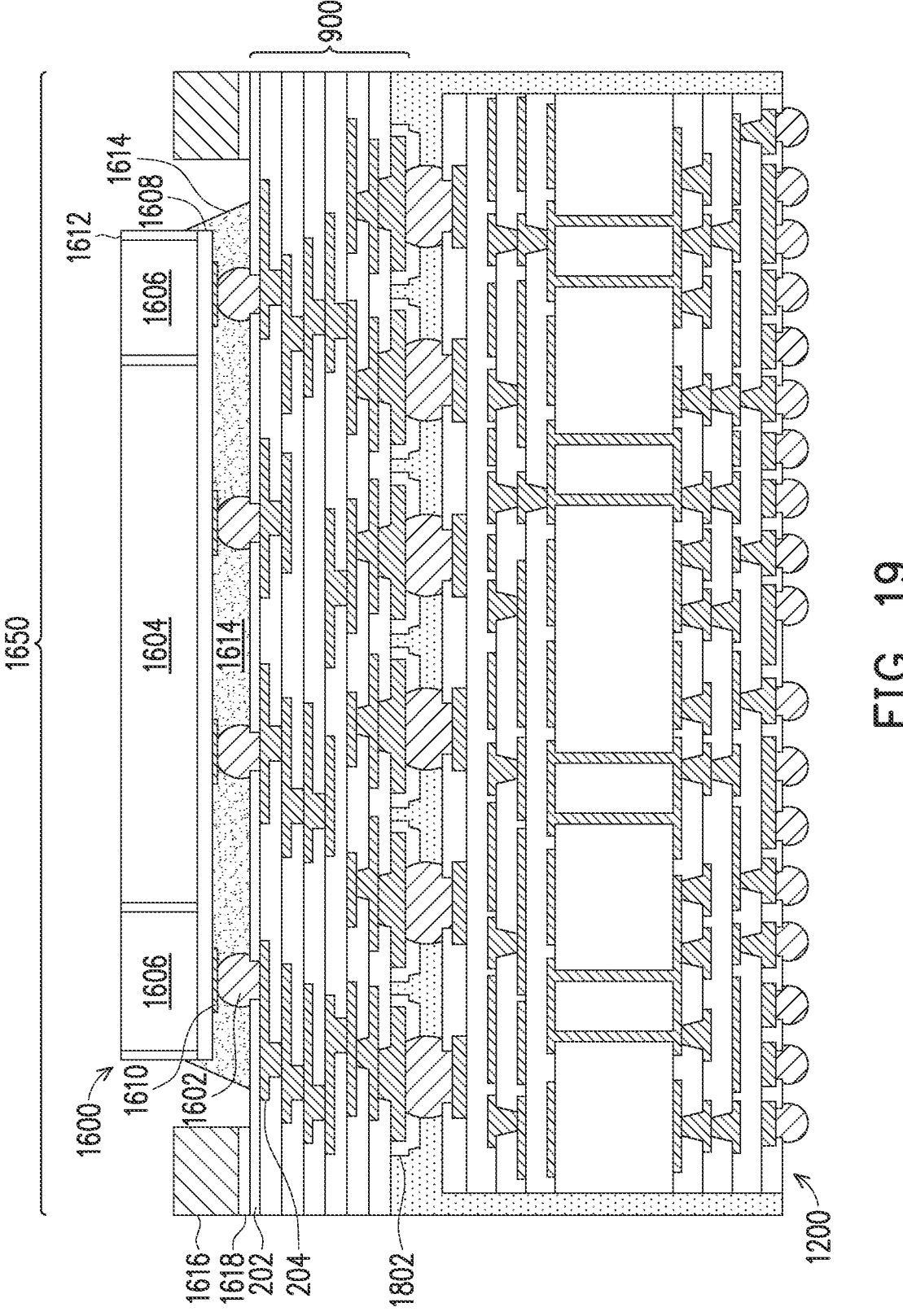

FIGS. 18-19 are cross-sectional views of intermediate steps during a process for forming an integrated circuit package 1650, in accordance with some other embodiments. In FIG. 18, the structure of FIG. 10 is formed according to the processing steps discussed above. In this embodiment, the buffer layer 1002 is patterned to form buffer rings 1802 around the conductive bumps of the UBMs 902. The patterning of the buffer layer 1002 exposes a portion of the conductive bumps of the UBMs 902 as well as portions of the dielectric layer 802 disposed between the conductive bumps of the UBMs 902. The patterning may be by an acceptable process, such as by exposing the buffer layer 1002 to light and then developing the buffer layer 1002 after the exposure or by etching using, for example, an anisotropic etch. Each buffer ring 1802 is around a conductive bump of a UBM 902, and has an opening exposing a portion of the conductive bump. Further, each buffer ring 1802 is distinct and physically separated from adjacent buffer rings 1802.

In FIG. 19, appropriate steps as discussed above are performed to complete formation of the integrated circuit package 1650. In this embodiment, the semiconductor device 1600 is a package. The buffer rings 1802 may help buffer stress in a similar manner as the buffer layer 1002. In this embodiment, the encapsulant 1302 is dispensed over the buffer rings 1802, over exposed portions of the dielectric layer 802, and along the sidewalls of the interposer 1200. Further, the encapsulant 1302 is disposed in the areas between the buffer rings 1802. Each conductive connector 1250 extends through a respective buffer ring 1802.

Figure 20:
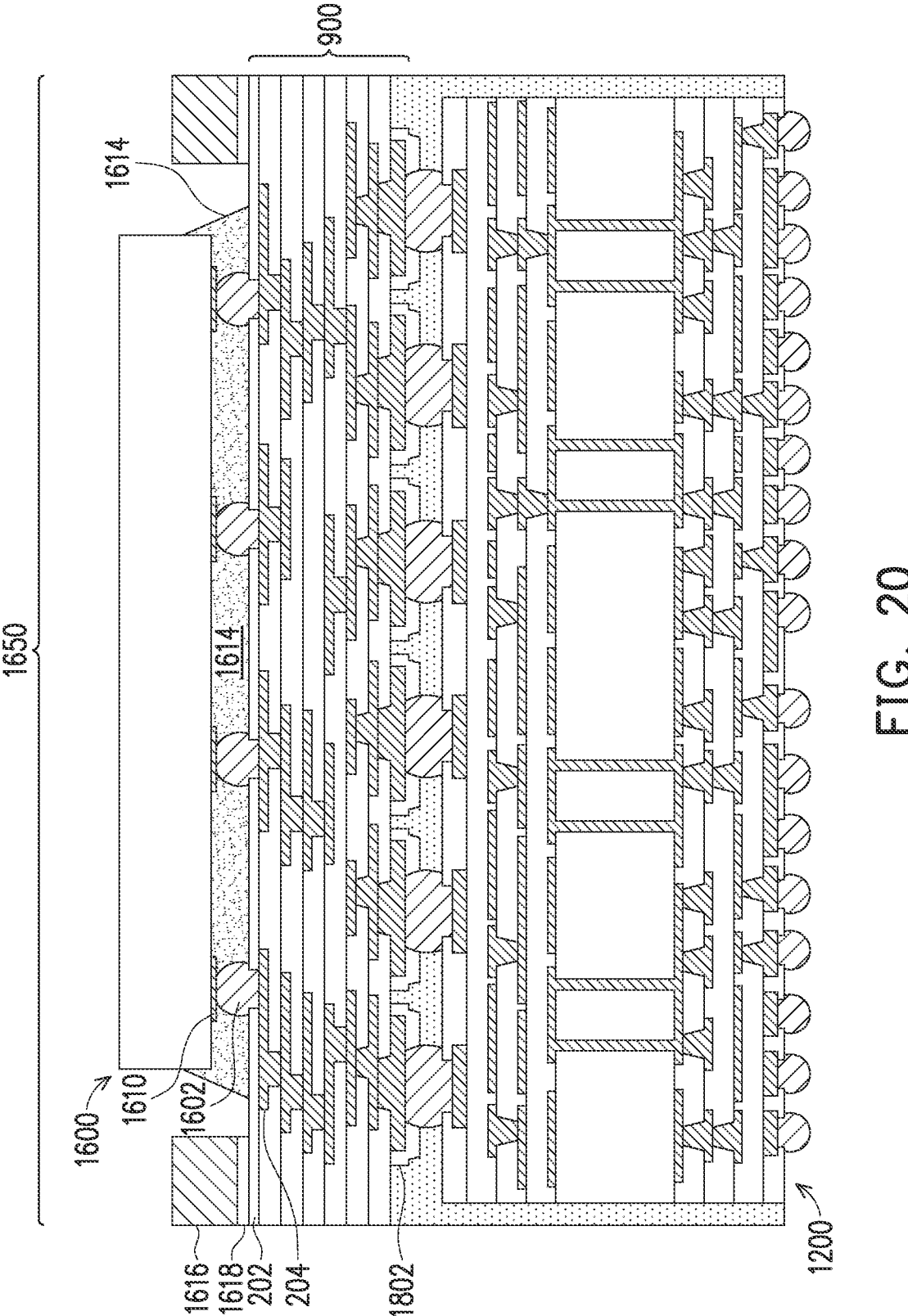
FIG. 20 is a cross-sectional view of an integrated circuit package, in accordance with some other embodiments.

FIG. 20 is a cross-sectional view of an integrated circuit package 1650, in accordance with some other embodiments. This embodiment is similar to the embodiment of FIG. 19, except the semiconductor device 1600 is a semiconductor die (or chip). As a result, the semiconductor device 1600 may not include an encapsulant or a redistribution structure.

By adding buffer features (e.g., the buffer layer 1002 or the buffer rings 1802) over portions of the conductive bumps of the UBMs 902 and on the dielectric layer 802, above advantages can be achieved. Including the buffer layer 1002 or the buffer rings 1802 in the integrated circuit package 1650 reduces stress in the redistribution structure 900, helping to reduce the risk of cracking occurring at edges of the conductive bumps of the UBMs 902. The buffer layer 1002 or the buffer rings 1802 may thus help mitigate a CTE mismatch between the semiconductor device 1600 and the interposer 1200. Further, the surface treatment process 904 may help strengthen the bonds between the buffer layer 1002 or the buffer rings 1802 and the dielectric layer 802. Forming strong bonds between the buffer layer 1002 or the buffer rings 1802 and the dielectric layer 802 may help improve the ability of the buffer layer 1002 or the buffer rings 1802 to release stress. The reliability of the integrated circuit package 1650 may thus be improved.

Figure 21:
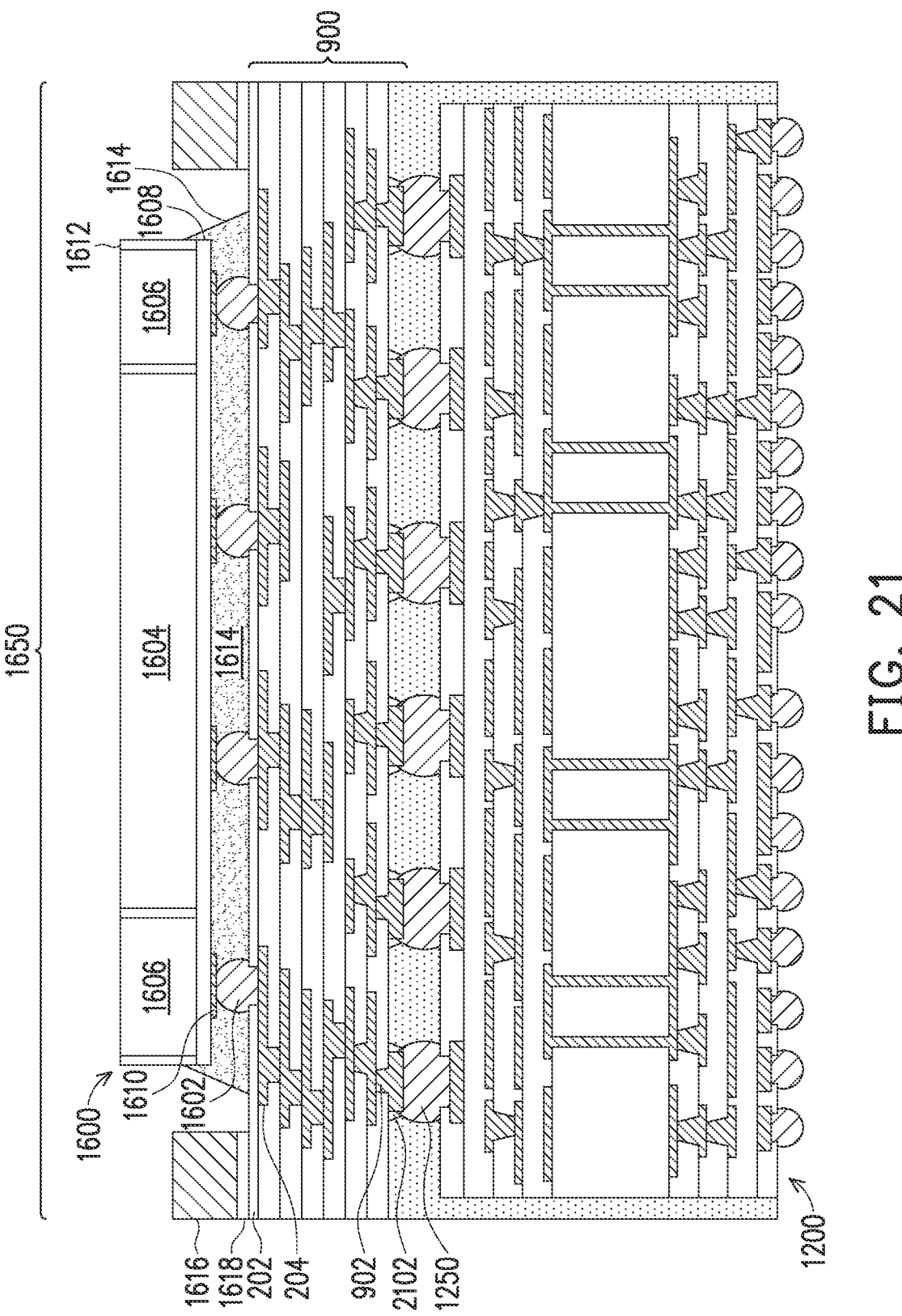
FIG. 21 is a cross-sectional view of an integrated circuit package, in accordance with some other embodiments.

FIG. 21 is a cross-sectional view of an integrated circuit package 1650, in accordance with some other embodiments. In this embodiment, the integrated circuit package 1650 is formed in a similar manner as discussed above, however the formation of the buffer layer 1002/buffer rings 1802 is omitted. Accordingly, in this embodiment, the surface treatment process 904 is also omitted. In this embodiment, the conductive connectors 1250 comprise flux and are formed in a flux dipping process. When the conductive connectors 1250 are reflowed, a flux residue remains around the edge of the UBMs 902 along the major surface of the dielectric layer 802, where the flux residue forms joint reinforcing structures 2102. In an embodiment, a joint reinforcing structure 2102 completely covers the edge of the respective UBM 902 along the major surface of the dielectric layer 802. The joint reinforcing structures 2102 may also help mitigate stress at the edges of the UBMs 902.

Figure 22:
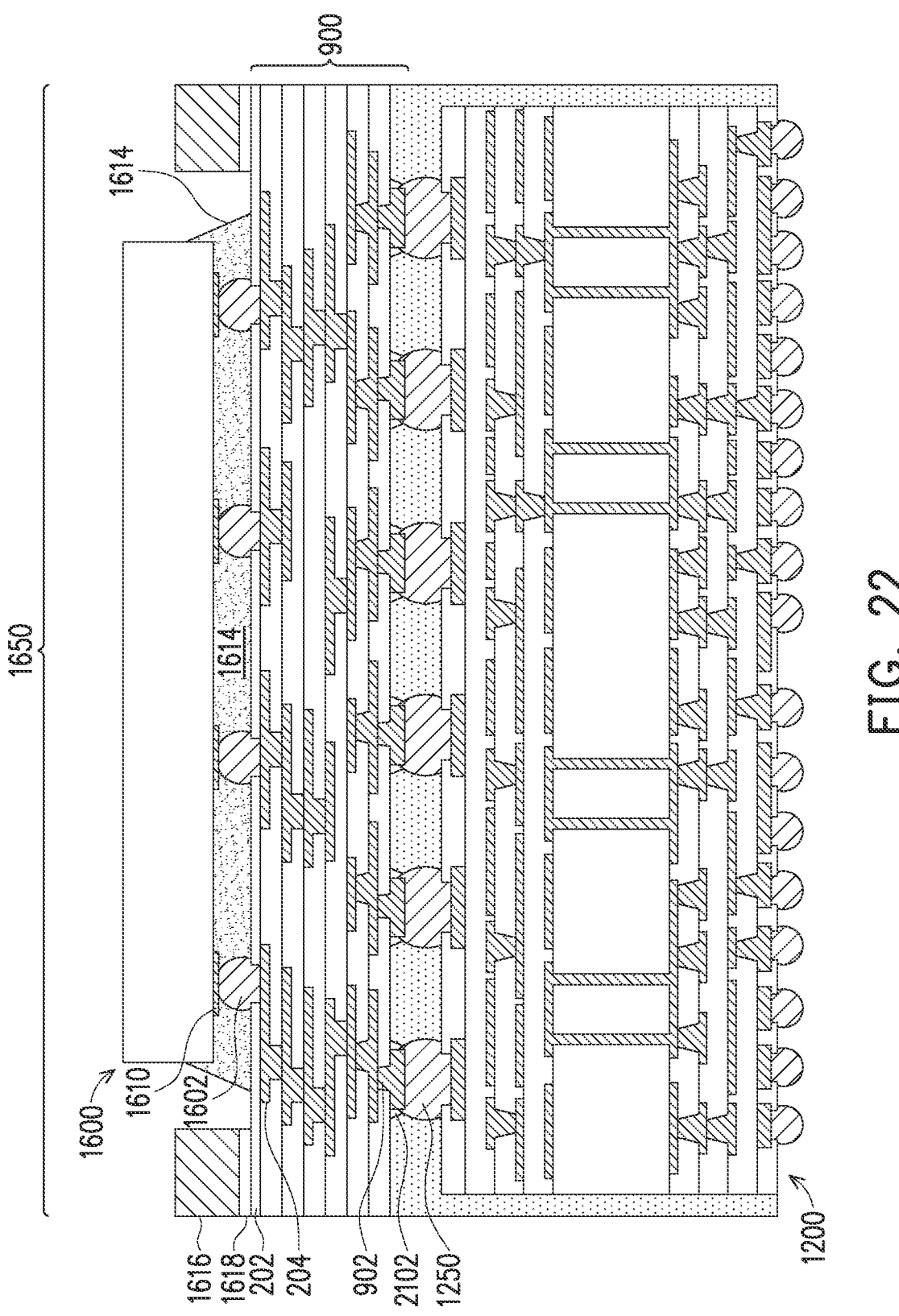
FIG. 22 is a cross-sectional view of an integrated circuit package, in accordance with some other embodiments.

FIG. 22 is a cross-sectional view of an integrated circuit package 1650, in accordance with some other embodiments. This embodiment is similar to the embodiment of FIG. 21, except the semiconductor device 1600 is a semiconductor die (or chip). As a result, the semiconductor device 1600 may not include an encapsulant or a redistribution structure.

In accordance with some embodiments of the present disclosure a method includes: forming a redistribution structure on a carrier substrate; forming dangling bonds on an upper dielectric layer of the redistribution structure by treating the upper dielectric layer; forming a buffer layer on the upper dielectric layer and on an under-bump metallization of the redistribution structure by bonding a buffer material to the dangling bonds; patterning the buffer layer with a first opening exposing the under-bump metallization; and connecting an interposer to the under-bump metallization with a first conductive connector, the first conductive connector disposed in the first opening. In an embodiment the dangling bonds are hydroxyl groups and treating the upper dielectric layer includes performing a plasma treatment process with $O_2$, $N_2$, $H_2$, or a combination thereof. In an embodiment the buffer material is a photosensitive polymer and patterning the buffer layer includes exposing the buffer layer to light and developing the buffer layer. In an embodiment the buffer material is a molding compound and patterning the buffer layer includes drilling the buffer layer. In an embodiment the upper dielectric layer has a first thickness, the buffer layer has a second thickness, and second thickness is greater than the first thickness. In an embodiment the upper dielectric layer is disposed on a middle dielectric layer of the redistribution structure, a first bonding strength between the upper dielectric layer and the middle dielectric layer being less than a second bonding strength between the upper dielectric layer and the buffer layer. In an embodiment the method further includes: encapsulating the interposer and the first conductive connector; after encapsulating the interposer and the first conductive connector, exposing a lower dielectric layer of the redistribution structure by removing the carrier substrate; patterning the lower dielectric layer with a second opening exposing a metallization pattern of the redistribution structure; and connecting a semiconductor device to the metallization pattern with a second conductive connector the second conductive connector disposed in the second opening. In an embodiment the buffer layer completely covers the upper dielectric layer after the patterning the buffer layer. In an embodiment patterning the buffer layer exposes a portion of the upper dielectric layer.

In accordance with some embodiments of the present disclosure a method includes: forming a redistribution structure on a carrier substrate; forming a buffer layer on an upper dielectric layer and under-bump metallizations of the redistribution structure; patterning the buffer layer to expose the under-bump metallizations; connecting an interposer to the under-bump metallizations, the interposer having a first coefficient of thermal expansion; removing the carrier substrate to expose a lower dielectric layer of the redistribution structure; patterning the lower dielectric layer to expose a metallization pattern of the redistribution structure; and connecting a semiconductor device to the metallization pattern, the semiconductor device having a second coefficient of thermal expansion, the second coefficient of thermal expansion less than the first coefficient of thermal expansion. In an embodiment the interposer includes an organic substrate. In an embodiment the upper dielectric layer includes a photosensitive polymer and the lower dielectric layer includes a photoinsensitive polymer. In an embodiment the buffer layer includes the same material as the upper dielectric layer. In an embodiment the buffer layer includes a different material from the upper dielectric layer.

In accordance with some embodiments of the present disclosure a device includes: a redistribution structure including an upper dielectric layer and an under-bump metallization; a buffer feature on the under-bump metallization and the upper dielectric layer, the buffer feature covering an edge of the under-bump metallization, the buffer feature bonded to the upper dielectric layer; a reflowable connector extending through the buffer feature, the reflowable connector coupled to the under-bump metallization; an interposer coupled to the reflowable connector; and an encapsulant around the interposer and the reflowable connector, the encapsulant different from the buffer feature. In an embodiment the interposer includes an organic substrate. In an embodiment the interposer includes a solder resist, the reflowable connector extending through the solder resist, the solder resist different from the buffer feature. In an embodiment the buffer feature is a buffer layer that completely covers the upper dielectric layer. In an embodiment the buffer feature is a buffer ring that covers a portion of the upper dielectric layer. In an embodiment the interposer has a first coefficient of thermal expansion, the redistribution structure further includes a metallization pattern, and the device further includes a semiconductor device coupled to the metallization pattern, the semiconductor device and the interposer disposed at opposite sides of the redistribution structure, the semiconductor device having a second coefficient of thermal expansion, the second coefficient of thermal expansion less than the first coefficient of thermal expansion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a redistribution structure on a carrier substrate;

forming dangling bonds on an upper dielectric layer of the redistribution structure by treating the upper dielectric layer;

forming a buffer layer on the upper dielectric layer and on an under-bump metallization of the redistribution structure by bonding a buffer material to the dangling bonds;

patterning the buffer layer with a first opening exposing the under-bump metallization;

connecting an interposer to the under-bump metallization with a first conductive connector, the first conductive connector disposed in the first opening;

encapsulating the interposer and the first conductive connector;

after encapsulating the interposer and the first conductive connector, exposing a lower dielectric layer of the redistribution structure by removing the carrier substrate;

patterning the lower dielectric layer with a second opening exposing a metallization pattern of the redistribution structure; and connecting a semiconductor device to the metallization pattern with a second conductive connector, the second conductive connector disposed in the second opening.

2. The method of claim 1, wherein the dangling bonds are hydroxyl groups and treating the upper dielectric layer comprises performing a plasma treatment process with $O_2$, $N_2$, $H_2$, or a combination thereof.

3. The method of claim 1, wherein the buffer material is a photosensitive polymer and patterning the buffer layer comprises exposing the buffer layer to light and developing the buffer layer.

4. The method of claim 1, wherein the buffer material is a molding compound and patterning the buffer layer comprises drilling the buffer layer.

5. The method of claim 1, wherein the upper dielectric layer has a first thickness, the buffer layer has a second thickness, and the second thickness is greater than the first thickness.

6. The method of claim 1, wherein the upper dielectric layer is disposed on a middle dielectric layer of the redistribution structure, a first bonding strength between the upper dielectric layer and the middle dielectric layer being less than a second bonding strength between the upper dielectric layer and the buffer layer.

7. The method of claim 1, wherein the buffer layer completely covers the upper dielectric layer after the patterning the buffer layer.

8. The method of claim 1, wherein patterning the buffer layer exposes a portion of the upper dielectric layer.

9. A method comprising:

forming a redistribution structure on a carrier substrate;

forming a buffer layer on an upper dielectric layer and under-bump metallizations of the redistribution structure;

patterning the buffer layer to expose the under-bump metallizations;

connecting an interposer to the under-bump metallizations, the interposer having a first coefficient of thermal expansion;

removing the carrier substrate to expose a lower dielectric layer of the redistribution structure;

patterning the lower dielectric layer to expose a metallization pattern of the redistribution structure; and connecting a semiconductor device to the metallization pattern, the semiconductor device having a second coefficient of thermal expansion, the second coefficient of thermal expansion less than the first coefficient of thermal expansion.

10. The method of claim 9, wherein the interposer comprises an organic substrate.

11. The method of claim 9, wherein the upper dielectric layer comprises a photosensitive polymer and the lower dielectric layer comprises a photoinsensitive polymer.

12. The method of claim 9, wherein the buffer layer comprises the same material as the upper dielectric layer.

13. The method of claim 9, wherein the buffer layer comprises a different material from the upper dielectric layer.

14. A method comprising:

forming a redistribution structure on a carrier substrate, the redistribution structure including an outer insulating layer;

forming an under-bump metallization on a first side of the redistribution structure, the under-bump metallization extending through the outer insulating layer;

forming a buffer layer over the first side of the redistribution structure and the under-bump metallization, wherein the outer insulating layer is disposed on a middle dielectric layer of the redistribution structure, a first bonding strength between the outer insulating layer and the middle dielectric layer being less than a second bonding strength between the outer insulating layer and the buffer layer;

curing the buffer layer, wherein the buffer layer bonds to the outer insulating layer using covalent bonds;

patterning the buffer layer to expose a surface of the under-bump metallization, the buffer layer remaining along sidewalls of the under-bump metallization;

attaching an interposer to the under-bump metallization using a first conductive connector, the interposer having a first coefficient of thermal expansion (CTE); and attaching a semiconductor device to a second side of the redistribution structure, the semiconductor device having a second CTE different than the first CTE.

15. The method of claim 14, wherein the buffer layer has a Young's modulus in a range of 0.05 GPa to 30 GPa.

16. The method of claim 14, wherein patterning the buffer layer comprises patterning a ring around the under-bump metallization.

17. The method of claim 14, wherein the redistribution structure includes an outer insulating layer, wherein the under-bump metallization extends through the outer insulating layer, wherein the buffer layer completely covers the outer insulating layer after patterning the buffer layer.

18. The method of claim 14, wherein the buffer layer comprises a resin with fillers disposed therein.

19. The method of claim 14, further comprising:

prior to forming the buffer layer, performing a treatment process on the outer insulating layer to create dangling bonds.

20. The method of claim 1, further comprising:

curing the buffer layer, wherein after curing the buffer layer is bonded to the upper dielectric layer with covalent bonds.

\* \* \* \* \*